(12) United States Patent
Ueda et al.

(10) Patent No.: US 10,355,100 B1
(45) Date of Patent: Jul. 16, 2019

(54) FIELD EFFECT TRANSISTORS HAVING DIFFERENT STRESS CONTROL LINERS AND METHOD OF MAKING THE SAME

(71) Applicant: SANDISK TECHNOLOGIES LLC, Plano, TX (US)

(72) Inventors: Yu Ueda, Yokkaichi (JP); Tomoyuki Obu, Yokkaichi (JP); Kazutaka Yoshizawa, Yokkaichi (JP); Yasuyuki Aoki, Yokkaichi (JP); Eisuke Takii, Yokkaichi (JP); Akio Nishida, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/982,266

(22) Filed: May 17, 2018

(51) Int. Cl.
| | |
|---|---|
| *H01L 29/51* | (2006.01) |
| *H01L 29/78* | (2006.01) |
| *H01L 27/115* | (2017.01) |
| *H01L 27/092* | (2006.01) |
| *H01L 23/532* | (2006.01) |
| *H01L 27/1157* | (2017.01) |
| *H01L 27/11524* | (2017.01) |
| *H01L 27/11529* | (2017.01) |

(52) U.S. Cl.
CPC ...... *H01L 29/518* (2013.01); *H01L 23/53295* (2013.01); *H01L 27/092* (2013.01); *H01L 27/0922* (2013.01); *H01L 27/1157* (2013.01); *H01L 27/11524* (2013.01); *H01L 27/11529* (2013.01); *H01L 29/7843* (2013.01)

(58) Field of Classification Search
CPC .......... H01L 27/11524; H01L 27/11529; H01L 27/092; H01L 27/0922; H01L 21/76829; H01L 29/7843; H01L 29/518; H01L 23/53295
See application file for complete search history.

(56) References Cited

U.S. PATENT DOCUMENTS

| | | |
|---|---|---|
| 6,091,121 A | 7/2000 | Oda |
| 6,503,826 B1 | 1/2003 | Oda |
| 7,193,269 B2 | 3/2007 | Toda et al. |

(Continued)

OTHER PUBLICATIONS

U.S. Appl. No. 15/593,916, filed May 12, 2017, SanDisk Technologies LLC.

(Continued)

*Primary Examiner* — Thanhha S Pham
(74) *Attorney, Agent, or Firm* — The Marbury Law Group, PLLC

(57) ABSTRACT

A first field effect transistor and a second field effect transistor are formed on a substrate. A silicon nitride liner is formed over the first field effect transistor and the second field effect transistor. An upper portion of the silicon nitride liner is converted into a thermal silicon oxide liner. A lower portion of the silicon nitride liner remains as a silicon nitride material portion. A first portion of the thermal silicon oxide liner is removed from above the second field effect transistor, and a second portion of the thermal silicon oxide liner remains above the first field effect transistor. Selective presence of the silicon oxide liner provides differential stress within the channels of the first and second field effect transistors, which can be employed to optimize performance of different types of field effect transistors.

9 Claims, 19 Drawing Sheets

(56) References Cited

U.S. PATENT DOCUMENTS

| | | |
|---|---|---|
| 7,482,671 B2 | 1/2009 | Toda et al. |
| 7,492,014 B2 | 2/2009 | Pidin |
| 7,611,935 B2 | 11/2009 | Krivokapic |
| 7,863,646 B2 | 1/2011 | Belyansky et al. |
| 7,902,082 B2 | 3/2011 | Park et al. |
| 8,467,233 B2 | 6/2013 | Yu et al. |
| 9,859,422 B2 | 1/2018 | Nishikawa et al. |
| 2005/0032275 A1 | 2/2005 | Toda et al. |
| 2006/0014350 A1 | 1/2006 | Wang et al. |
| 2006/0163647 A1 | 7/2006 | Toda et al. |
| 2006/0214241 A1 | 9/2006 | Pidin |
| 2008/0293195 A1 | 11/2008 | Krivokapic |
| 2009/0081840 A1 | 3/2009 | Park et al. |
| 2009/0152638 A1 | 6/2009 | Belyansky et al. |
| 2012/0307550 A1 | 12/2012 | Yu et al. |
| 2015/0179740 A1* | 6/2015 | Triyoso ............... H01L 29/7843 257/288 |
| 2016/0351709 A1 | 12/2016 | Nishikawa et al. |

OTHER PUBLICATIONS

U.S. Appl. No. 15/617,499, filed Jun. 8, 2017, SanDisk Technologies LLC.
U.S. Appl. No. 15/916,720, filed Mar. 9, 2018, SanDisk Technologies LLC.
U.S. Appl. No. 15/933,947, filed Mar. 23, 2018, SanDisk Technologies LLC.

* cited by examiner

FIELD EFFECT TRANSISTORS HAVING DIFFERENT STRESS CONTROL LINERS AND METHOD OF MAKING THE SAME

FIELD

The present disclosure generally relates to semiconductor devices, and particularly to field effect transistors containing different stress control liners, and methods of manufacturing the same.

BACKGROUND

Recently, ultra-high-density storage devices employing three-dimensional (3D) memory stack structures have been proposed. Such memory stack structures can employ an architecture known as Bit Cost Scalable (BiCS) architecture. For example, a 3D NAND stacked memory device can be formed from an array of an alternating stack of insulating materials and spacer material layers that are formed as electrically conductive layers or replaced with electrically conductive layers. Memory openings are formed through the alternating stack, and are filled with memory stack structures, each of which includes a vertical stack of memory elements and a vertical semiconductor channel.

SUMMARY

According to an aspect of the present disclosure, a semiconductor structure comprises a first field effect transistor and a second field effect transistor located on a substrate; a silicon nitride liner continuously extending over the first field effect transistor and the second field effect transistor; a thermal silicon oxide liner extending over the first field effect transistor and not extending over the second field effect transistor; and a planarization dielectric layer contacting the thermal silicon oxide liner over the first field effect transistor and contacting the silicon nitride liner over the second field effect transistor.

According to another aspect of the present disclosure, a method of forming a semiconductor structure is provided, which comprises: forming a first field effect transistor and a second field effect transistor on a substrate; forming a silicon nitride liner over the first field effect transistor and the second field effect transistor; converting an upper portion of the silicon nitride liner into a thermal silicon oxide liner, wherein a lower portion of the silicon nitride liner remains as a silicon nitride material portion; and removing a second portion of the thermal silicon oxide liner from above the second field effect transistor, wherein a first portion of the thermal silicon oxide liner remains above the first field effect transistor.

DETAILED DESCRIPTION

Charge carrier mobility in the channels of field effect transistors is affected by stress in the channel. Different types of field effect transistors require different types of stress in order to provide optimal performance. For example, p-type field effect transistors generally provide higher performance under a compressive stress in the channel, while n-type field effect transistors generally provide higher performance under a tensile stress. The embodiments of the present disclosure provide different types of stress control liners to field effect transistors with a minimal increase in processing cost and process time. One embodiment of the present disclosure is directed to a method of making field effect transistor including oxidation of a silicon nitride stress control liner to form a silicon oxide liner and controlled etch back of the silicon oxide liner, the various aspects of which are discussed in detail herebelow.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

Figure 1A:
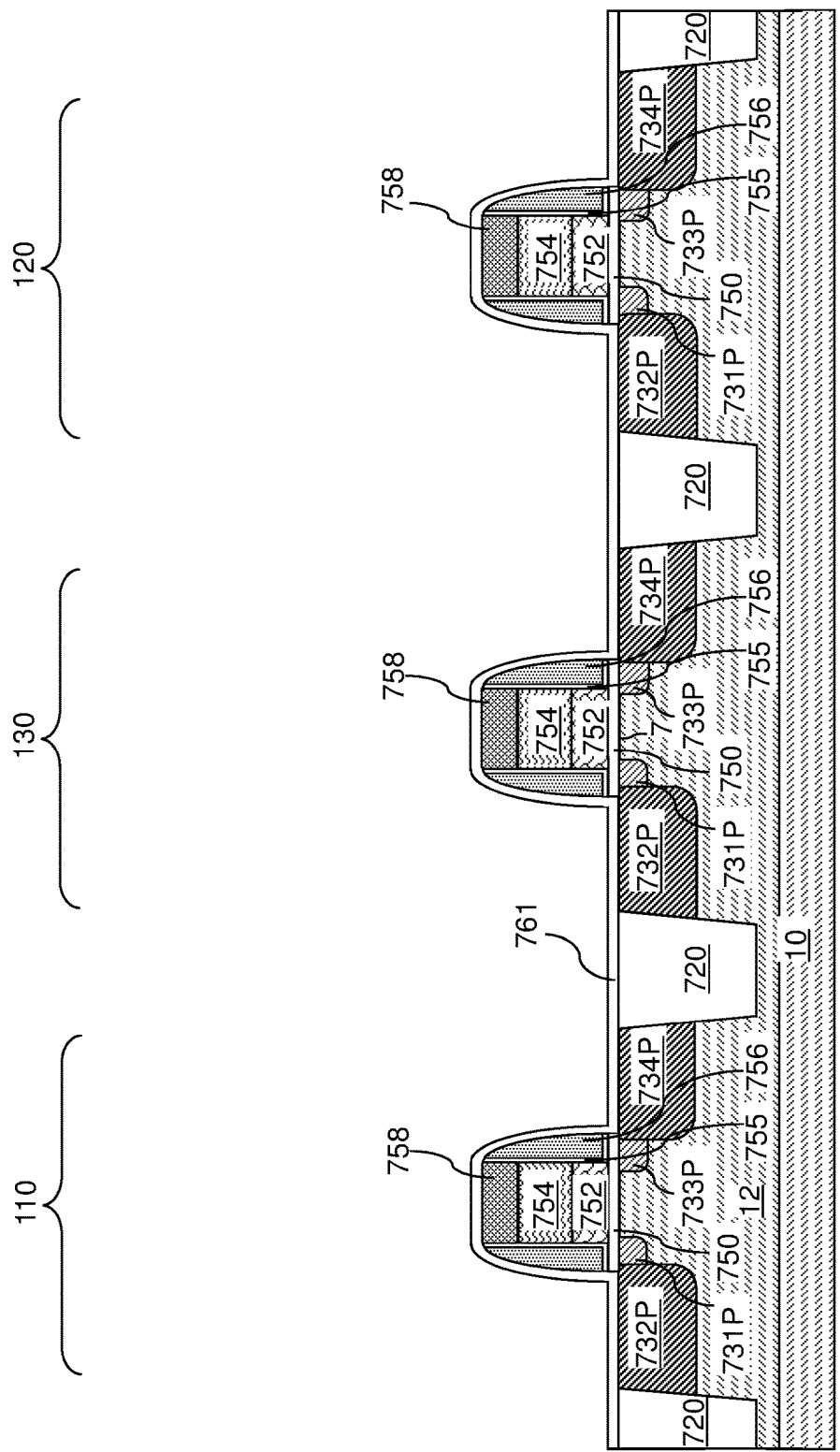
FIG. 1A is a vertical cross-sectional view of a first region of an exemplary semiconductor structure after formation of first, second, and third p-type field effect transistors and a continuous silicon oxide liner on a semiconductor substrate according to an embodiment of the present disclosure.
Figure 1B:
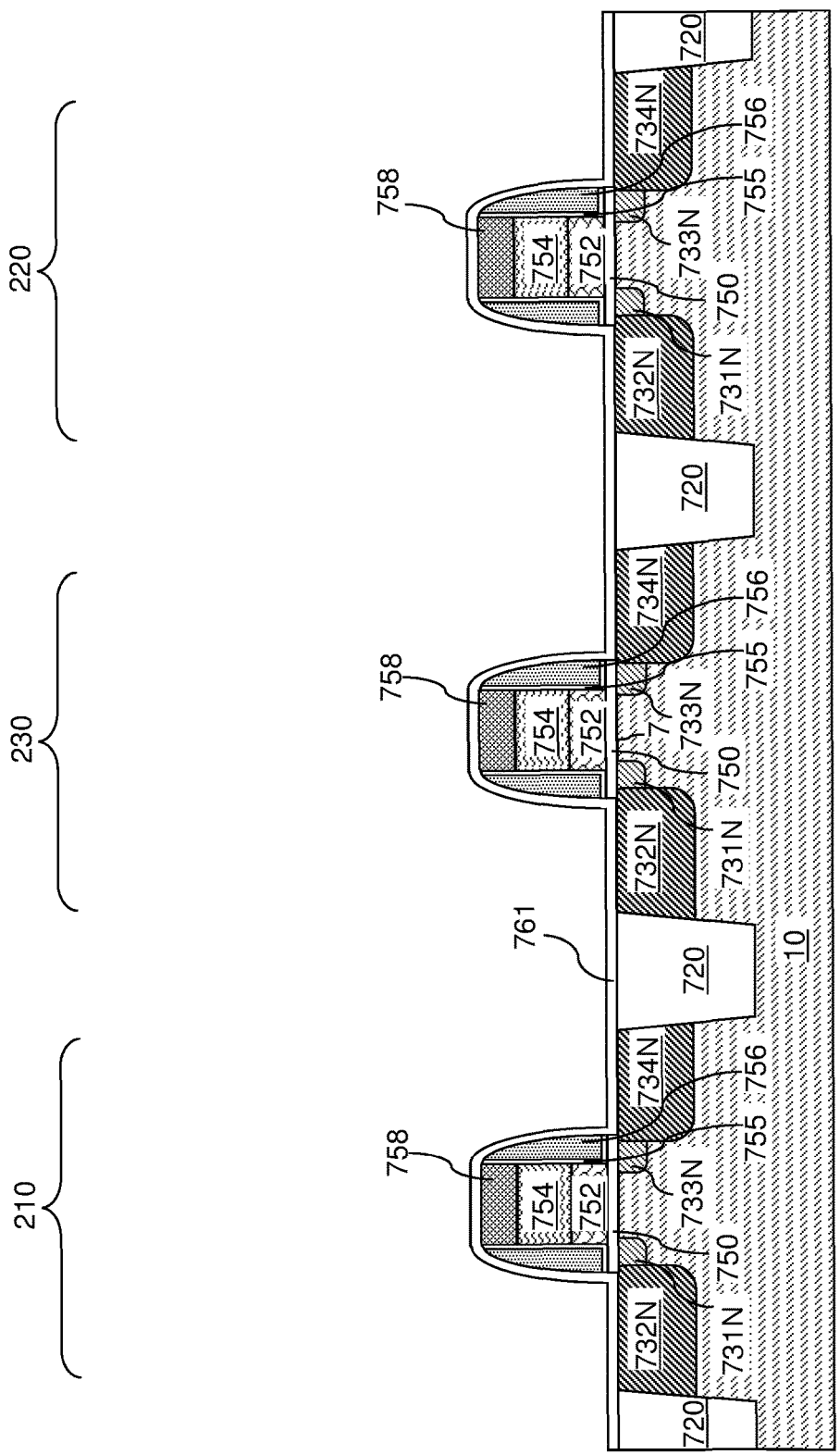
FIG. 1B is a vertical cross-sectional view of a second region of the exemplary semiconductor structure after formation of first, second, and third n-type field effect transistors and the continuous silicon oxide liner on the semiconductor substrate according to an embodiment of the present disclosure.

Referring to FIGS. 1A and 1B, an exemplary semiconductor structure according to an embodiment of the present disclosure is provided. The exemplary semiconductor structure includes a first p-type field effect transistor 110, a second p-type field effect transistor 120, a third p-type field effect transistor 130, a first n-type field effect transistor 210, a second n-type field effect transistor 220, and a third n-type field effect transistor 230. Each field effect transistor represents a respective type of field effect transistor that can be formed according to embodiments of the present disclosure.

In one embodiment, transistor 110 can be a low voltage transistor (e.g., a 1.2V transistor), transistor 120 can be a high (i.e., higher) voltage transistor (e.g., a 5V transistor), and transistor 130 can be an intermediate voltage (i.e., voltage between the high and low voltage) transistor (e.g., a 2.5V transistor). In one embodiment, transistor 220 can be a low voltage transistor (e.g., a 1.2V transistor), transistor 210 can be a high (i.e., higher) voltage transistor (e.g., a 5V transistor), and transistor 230 can be an intermediate voltage (i.e., voltage between the high and low voltage) transistor (e.g., a 2.5V transistor). The high voltage transistors may have a thicker gate dielectric 750 than then intermediate and low voltage transistors, while the intermediate voltage transistors may have a thicker gate dielectric 750 than the low voltage transistors.

Figure 1C:
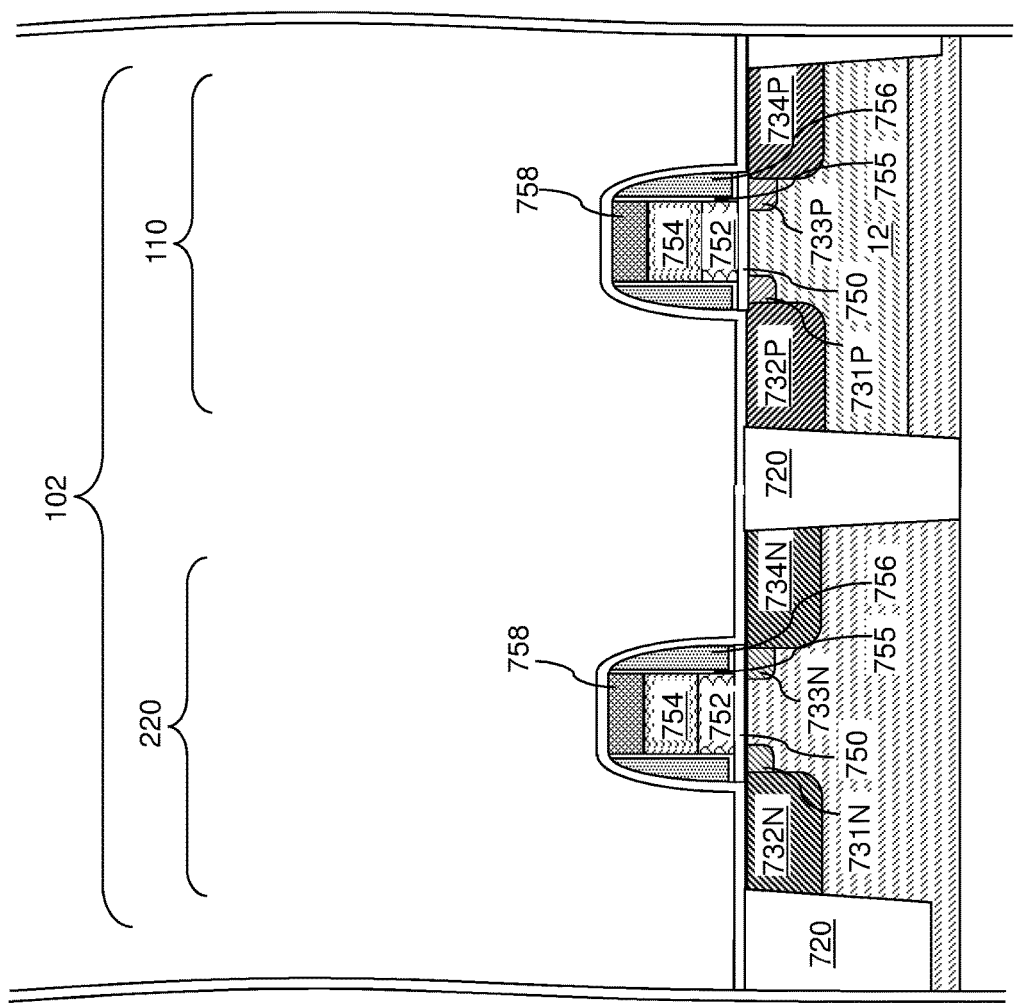
FIG. 1C is a vertical cross-sectional view of first and second regions of the exemplary semiconductor structure in a CMOS configuration.

In another embodiment shown in FIG. 1C, the exemplary structure can be employed in a complementary metal oxide semiconductor (CMOS) configuration (i.e., in a CMOS device 102) having one p-type transistor 110 and one n-type transistor 220. In this embodiment, transistors 110 and 220 may be the same voltage transistors of opposite conductivity type.

Multiple instances of each type of the field effect transistors (110, 120, 130, 21, 220, 230) can be formed on a semiconductor substrate. Further, one or more types of field effect transistors may be omitted in alternative embodiments of the present disclosure. As such, the total number of instances (including zero) for each type of field effect transistors may be selected to as needed, and all such variations are expressly contemplated herein.

The exemplary structure includes a substrate, which can be a semiconductor substrate (10, 12). As used herein, the semiconductor substrate (10, 12) may be a semiconductor wafer, and can include at least one elemental semiconductor material (e.g., single crystal silicon wafer or layer), at least one III-V compound semiconductor material, or at least one II-VI compound semiconductor material. The semiconductor substrate (10, 12) may have one or more doped wells 12 in its top surface and/or one or more semiconductor layers located over its top surface. The semiconductor substrate (10, 12) can include a substrate semiconductor layer 10 having a doping of a first conductivity type (such as p-type or n-type), and at least one doped well 12 having a doping of a second conductivity type that is the opposite of the first conductivity type. The substrate semiconductor layer 10 can be provided as a semiconductor material layer over a commercially available semiconductor substrate (e.g., silicon wafer) or can be a top portion of the bulk semiconductor substrate (e.g., silicon wafer). Alternatively, the substrate semiconductor layer 10 may comprise a semiconductor layer formed on a top surface of an insulating or conductive substrate, such as a silicon-on-insulator type substrate.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material"

or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

The substrate semiconductor layer 10 can include a single crystalline semiconductor material such as single crystalline silicon. The atomic concentration of first conductivity type dopants in the substrate semiconductor layer 10 can be in a range from $1.0 \times 10^{14}/cm^3$ to $1.0 \times 10^{17}/cm^3$, although lesser and greater atomic concentrations can also be employed. The doped well 12 can be formed by implanting dopants of the second conductivity through the top surface 7 of the semiconductor substrate into a surface portion of the substrate semiconductor layer 10. The net dopant concentration (i.e., the atomic concentration of the second conductivity type dopants less the atomic concentration of the first conductivity type dopants) in the doped well 12 can be in a range from $1.0 \times 10^{14}/cm^3$ to $1.0 \times 10^{17}/cm^3$, although lesser and greater atomic concentrations can also be employed.

Generally, a p-doped semiconductor material region and an n-doped semiconductor material region are formed in the semiconductor substrate (10, 12). The device region including the n-doped semiconductor material region within the semiconductor substrate (10, 12) is herein referred to as a p-type field effect transistor region or a PMOS region. The device region including the p-doped semiconductor material region within the semiconductor substrate (10, 12) is herein referred to as an n-type field effect transistor region or an NMOS region. In the illustrated example, the substrate semiconductor layer 10 can have a p-type doping and the doped well can be 12 is formed with an n-type doping. Thus, the substrate semiconductor layer 10 corresponds to the p-doped semiconductor material region and the doped well 12 corresponds to the n-doped semiconductor material region. Alternatively, the substrate semiconductor layer 10 can have an n-type doping and the doped well can be formed with a p-type doping. In this case, the doped well corresponds to the p-doped semiconductor material region and the substrate semiconductor layer 10 corresponds to an n-doped semiconductor material region. While the present disclosure is described employing an embodiment in which the p-doped semiconductor material region comprises the substrate semiconductor layer 10 and the n-doped semiconductor material region comprises a doped well 12, embodiments are expressly contemplated in which the p-doped semiconductor material region comprises a doped well and the n-doped semiconductor material region comprises a substrate semiconductor layer.

Shallow trench isolation structures 720 can be formed in upper portions of the semiconductor substrate (10, 12) to provide electrical isolation among neighboring devices. For example, shallow trenches can be formed around each device region that requires electrical isolation from neighboring device regions, and can be filled with a dielectric material such as silicon oxide. Excess portions of the dielectric material can be removed from above the top surface of the semiconductor substrate (10, 12) by a planarization process such as chemical mechanical planarization. Remaining portions of the dielectric material in the shallow trenches constitute the shallow trench isolation structures 720.

A gate dielectric layer, a semiconductor material layer, a metallic gate material layer, and a gate cap dielectric layer can be sequentially deposited on the top surface 7 of the semiconductor substrate (10, 12). The gate dielectric layer includes a gate dielectric material such as silicon oxide and/or a dielectric metal oxide. The semiconductor material layer can include a doped or undoped semiconductor material such as doped or undoped polysilicon or amorphous silicon. The metallic gate material layer includes a metal or metal alloy gate material such as tungsten, tungsten silicide, titanium silicide, etc. The gate cap dielectric layer includes a dielectric material such as silicon nitride.

The gate cap dielectric layer, the metallic gate material layer, and the semiconductor material layer can be patterned, for example, by application and patterning of a photoresist layer thereabove, and by transferring the pattern in the photoresist layer through the gate cap dielectric layer, the metallic gate material layer, and the semiconductor material layer employing an anisotropic etch process. The anisotropic etch process can stop on the top surface of the gate dielectric layer. Patterned portions of the gate cap dielectric layer constitute gate cap dielectrics 758, patterned portions of the metallic gate material layer constitute metallic gate electrode portions 754, and patterned portions of the semiconductor material layer constitute semiconductor gate electrode portions 752. Each stack of a semiconductor gate electrode portion 752, a metallic gate electrode portion 754, and a gate cap dielectric 758 constitutes a gate stack (752, 754, 758). The photoresist layer can be subsequently removed, for example, by ashing. The semiconductor gate electrode portions 752 in the p-type field effect transistor region can include a p-doped semiconductor material, while semiconductor gate electrode portions 752 in the n-type field effect transistor region can include an n-doped semiconductor material.

In one embodiment, the PMOS and/or NMOS transistors have a lightly doped drain-source (LDD) configuration. In this embodiment, a first block level photoresist layer can be applied and patterned to cover the n-type field effect transistor region while not covering the p-type field effect transistor region. P-type dopants can be implanted into surface portions of the semiconductor substrate (10, 12) in the p-type field effect transistor region that are not masked by the first block level photoresist layer or the gate stacks (752, 754, 758). Surface portions of the semiconductor substrate (10, 12) in the p-type field effect transistor region that are implanted with the p-type dopants form p-doped extension regions (731P, 733P). The p-doped extension regions (731P, 733P) include a first source extension region 731P and a first drain extension region 733P. Thus, the first source extension region 731P can be a p-doped source extension region, and the first drain extension region 733P can be a p-doped drain extension region. The first source extension region 731P and the first drain extension region 733P form p-n junctions with an underlying portion of the semiconductor substrate (10, 12), which can be, for example, the doped well 12 having an n-type doping. The first block level photoresist layer can be subsequently removed, for example, by ashing.

A second block level photoresist layer can be applied and patterned to cover the p-type field effect transistor region while not covering the n-type field effect transistor region. N-type dopants can be implanted into surface portions of the semiconductor substrate (10, 12) in the n-type field effect transistor region that are not masked by the second block level photoresist layer or the gate stacks (752, 754, 758). Surface portions of the semiconductor substrate (10, 12) in the n-type field effect transistor region that are implanted with the n-type dopants form n-doped extension regions (731N, 733N). The n-doped extension regions (731N, 733N) include a second source extension region 731N and a second drain extension region 733N that have an n-type doping. Thus, the second source extension region 731N can be an n-doped source extension region, and the second drain extension region 733N can be an n-doped drain extension region. The second source extension region 731N and the second drain extension region 733N form p-n junctions with an underlying portion of the semiconductor substrate (10, 12), which can be, for example, the substrate semiconductor layer 10 having a p-type doping. The second block level photoresist layer can be subsequently removed, for example, by ashing. Alternatively, if the NMOS and/or PMOS transistors do not have the LDD configuration, then the above implantation steps for forming the extension regions can be omitted.

A conformal gate dielectric liner including a first dielectric material such as silicon oxide can be deposited by a conformal deposition process. The conformal gate dielectric liner can have a thickness in a range from 2 nm to 10 nm, although lesser and greater thicknesses can also be employed. A continuous gate spacer dielectric layer including a second dielectric material such as silicon nitride can be subsequently deposited over the conformal gate dielectric liner. The thickness of vertical portions of the continuous gate spacer dielectric layer can be in a range from 5 nm to 50 nm, although lesser and greater thicknesses can also be employed. An anisotropic etch process can be performed to remove horizontal portions of the continuous gate spacer dielectric layer and the conformal gate dielectric liner. Remaining portions of the continuous gate spacer dielectric layer constitute gate dielectric spacers 756, and remaining portions of the conformal gate dielectric liner constitute gate dielectric liners 755. Portions of the gate dielectric layer that are not covered by the gate stacks (752, 754, 758), the gate dielectric liners 755, or the gate dielectric spacers 756 can be removed by a terminal portion of the anisotropic etch process. The anisotropic etch process can stop on the top surface of the semiconductor substrate (10, 12). Each remaining portion of the gate dielectric layer constitutes a gate dielectric 750.

A third block level photoresist layer can be applied over the exemplary structure, and can be patterned to cover the portion of the semiconductor substrate (10, 12) in the p-type field effect transistor region without covering the portion of the semiconductor substrate (10, 12) in the n-type field effect transistor region. N-type dopants can be implanted into unmasked portions of the exemplary structure to form n-doped active regions (732N, 734N). The n-doped active regions (732N, 734N) can include a second source region 732N and a second drain region 734N. The dopant concentration of the n-type dopants in the second source region 732N, and the second drain region 734N can be in a range from $1.0 \times 10^{20}/cm^3$ to $1.0 \times 10^{21}/cm^3$, although lesser and greater dopant concentrations can also be employed. The third block level photoresist layer can be subsequently removed, for example, by ashing.

A fourth block level photoresist layer can be applied over the exemplary structure, and can be patterned to cover the portion of the semiconductor substrate (10, 12) and overlying layers in the n-type field effect transistor region without covering the portion of the semiconductor substrate (10, 12) and the overlying layers in the p-type field effect transistor region. P-type dopants can be implanted into unmasked portions of the exemplary structure to form p-doped active regions (732P, 734P) in the implanted surface portions of the semiconductor substrate (10, 12) employing the second photoresist layer 757 as an implantation mask. The p-doped active regions (732P, 734P) can include a first source region 732P and a first drain region 734P. The dopant concentration of the p-type dopants in the first source region 732P, and the first drain region 734P can be in a range from $1.0 \times 10^{20}/cm^3$ to $1.0 \times 10^{21}/cm^3$, although lesser and greater dopant concentrations can also be employed. The fourth block level photoresist layer can be subsequently removed, for example, by ashing.

A silicon oxide liner 761 can be subsequently deposited on, and over, each of the field effect transistors (110, 120, 130, 210, 220, 230). The silicon oxide liner 761 includes silicon oxide and can be formed by a conformal deposition process. For example, the silicon oxide liner 761 can be formed by decomposition of a silicon oxide precursor such as tetraethylorthosilicate (TEOS) in a low pressure chemical vapor deposition (LPCVD) process. The thickness of the silicon oxide liner 761 can be in a range from 1 nm to 10 nm, although lesser and greater thicknesses can also be employed. The silicon oxide liner 761 promotes adhesion of a silicon nitride liner to be subsequently formed.

Figure 2A:
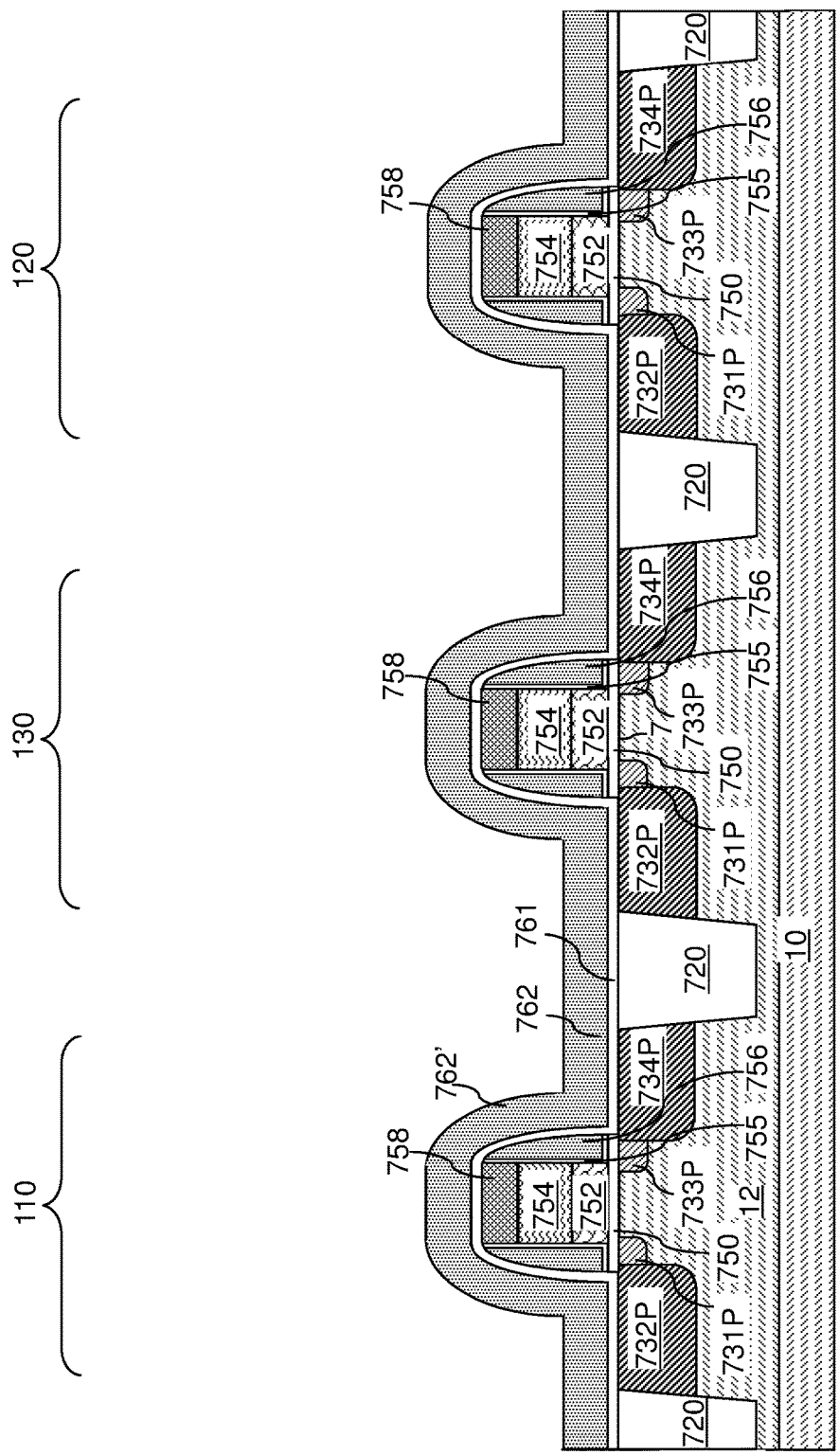
FIG. 2A is a vertical cross-sectional view of the first region of the exemplary semiconductor structure after formation of a silicon nitride liner according to an embodiment of the present disclosure.
Figure 2B:
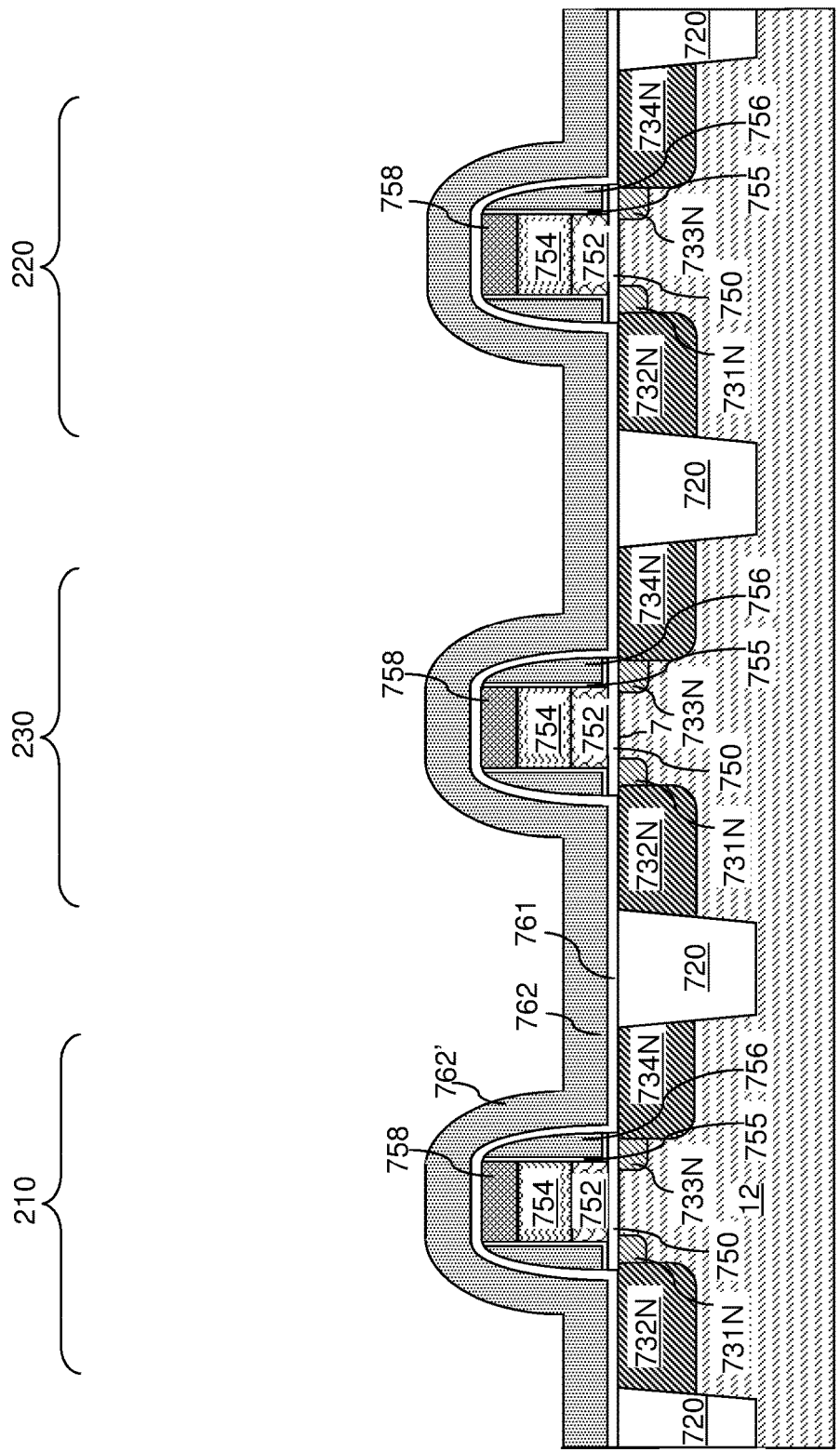
FIG. 2B is a vertical cross-sectional view of the second region of the exemplary semiconductor structure after formation of the silicon nitride liner according to an embodiment of the present disclosure.

Referring to FIGS. 2A and 2B, an in-process silicon nitride liner 762' can be deposited on the top surface of the silicon oxide liner 761. As used herein, an "in-process" element refers to an element that is modified in structure and/or in composition in a subsequent processing step. The in-process silicon nitride liner 762' is formed over each of the field effect transistors (110, 120, 130, 210, 220, 230), and covers the entire area of each field effect transistor (110, 120, 130, 210, 220, 230). In one embodiment, the in-process silicon nitride liner 762' comprises a silicon nitride material that generates tensile stress in respective underlying structures. The magnitude of the tensile stress generated by the in-process silicon nitride liner 762' depends on the composition of the in-process silicon nitride liner 762' and the deposition method employed to form the in-process silicon nitride liner 762'.

The in-process silicon nitride liner 762' can be deposited by plasma enhanced chemical vapor deposition, which induces incorporation of hydrogen into the in-process silicon nitride liner 762'. The ratio of the number of silicon-hydrogen bonds to the number of silicon-nitrogen bonds in the in-process silicon nitride liner 762' can significantly affect the level of tensile stress generated by the in-process silicon nitride liner 762'. The magnitude of the tensile stress generated by the in-process silicon nitride liner 762' can be in a range from 0.2 GPa to 1.5 GPa, although lesser and greater magnitudes of tensile stress may be employed. The in-process silicon nitride liner 762' may be deposited conformally or non-conformally. The thickness of the horizontal portions of the in-process silicon nitride liner 762' can be in a range from 10 nm to 100 nm, such as from 20 nm to 50 nm, although lesser and greater thicknesses can also be employed.

Figure 3A:
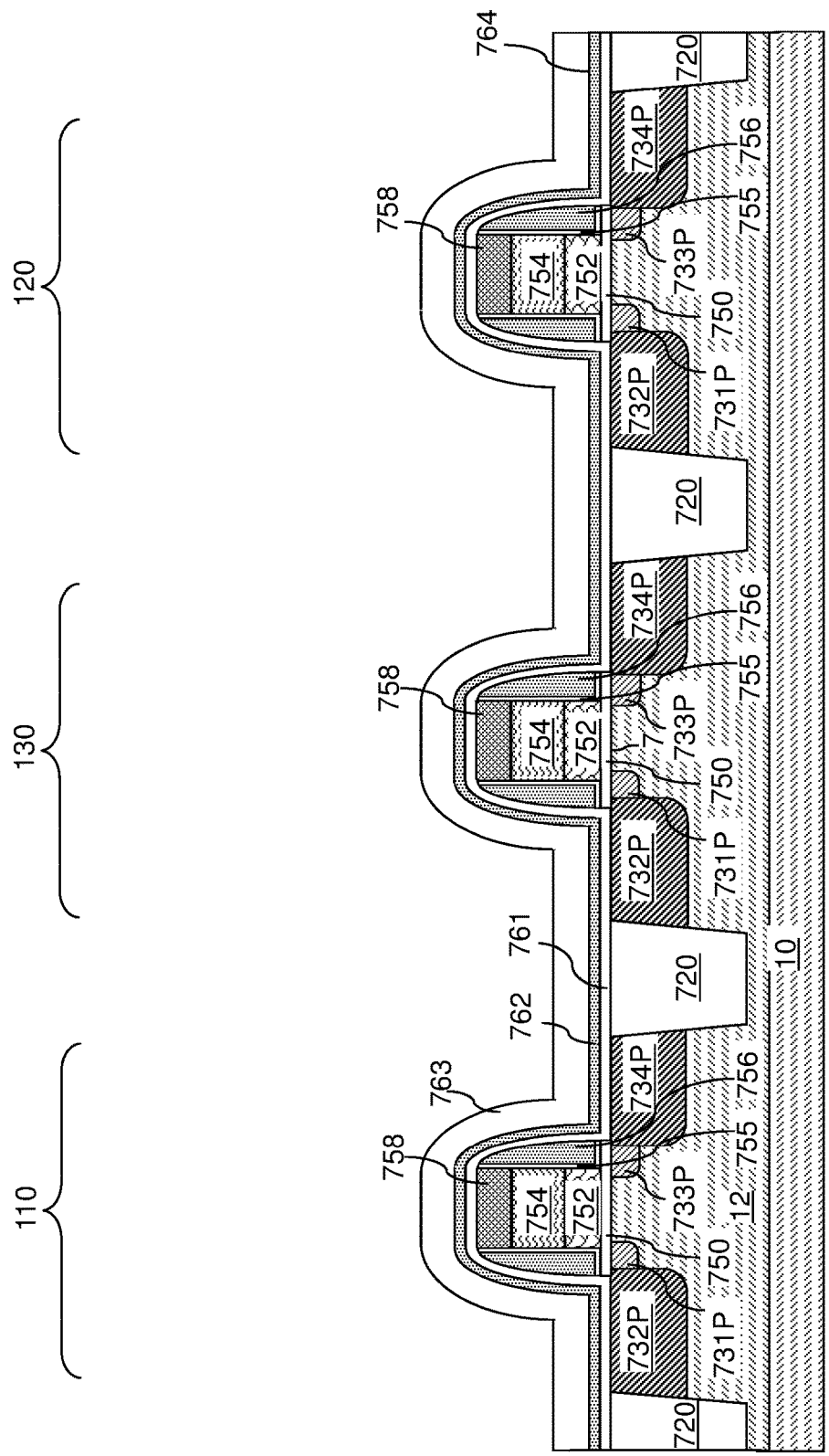
FIG. 3A is a vertical cross-sectional view of the first region of the exemplary semiconductor structure after conversion of an upper portion of the silicon nitride liner into a thermal silicon oxide liner according to an embodiment of the present disclosure.
Figure 3B:
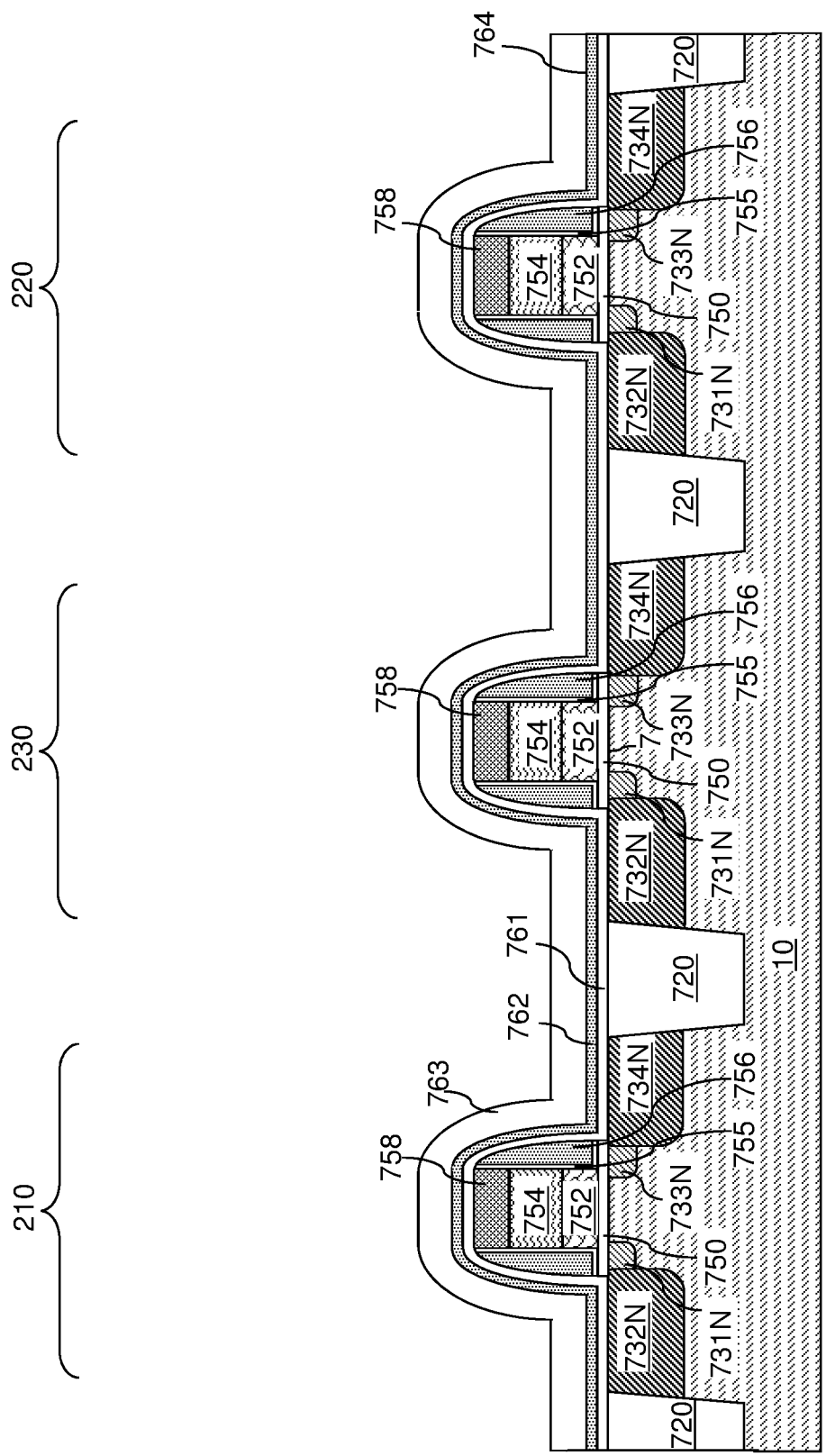
FIG. 3B is a vertical cross-sectional view of the second region of the exemplary semiconductor structure after conversion of the upper portion of the silicon nitride liner into the thermal silicon oxide liner according to an embodiment of the present disclosure.

Referring to FIGS. 3A and 3B, a thermal oxidation process can be performed to convert a continuous upper portion of the in-process silicon nitride liner 762' into a thermal silicon oxide liner 763. The exemplary structure can be placed within a process chamber and can be subjected to an oxidizing ambient at an elevated temperature. The oxidizing ambient include an oxygen-source gas, i.e., a gas that functions as the source of oxygen atoms. For example, the oxidizing ambient can include oxygen molecules or water vapor. The elevated temperature can be in a range from 700 degrees Celsius to 1,000 degrees Celsius, such as from 750 degrees Celsius to 950 degrees Celsius. For example, an oxidation furnace accommodating multiple semiconductor substrates may be employed to perform the thermal oxidation process.

The duration of the thermal oxidation process is selected such that the continuous upper portion of the in-process silicon nitride liner 762' is converted into the thermal silicon oxide liner 763 without converting a continuous lower portion of the in-process silicon nitride liner 762' into a silicon oxide material. The unconverted remaining silicon nitride material portion of the in-process silicon nitride liner 762' is herein referred to as a silicon nitride liner 762. The ratio of the thickness of horizontal portions of the thermal silicon oxide liner 763 to the thickness of the lower portion of the in-process silicon nitride liner 762' that remains as the silicon nitride material portion, i.e., as the silicon nitride liner 762, can be in a range from 0.1 to 10. In other words, the volume fraction of the thermally oxidized portion of the in-process silicon nitride liner 762' relative to the entire volume of the in-process silicon nitride liner 762' can be approximately in a range from 9% to 91% of the entire volume of the in-process silicon nitride liner 762', although lesser and greater volume fractions can also be employed.

In one embodiment, the thickness of the horizontal portions of the silicon nitride liner 762 can be in a range from 1 nm to 90 nm, such as from 5 nm to 75 nm, although lesser and greater thicknesses can also be employed. In one embodiment, the thickness of the horizontal portions of the thermal silicon oxide liner 763 can be in a range from 3 nm to 90 nm, such as from 10 nm to 75 nm, although lesser and greater thicknesses can also be employed.

In one embodiment, the thermal silicon oxide liner 763 can generate compressive stress in respective underlying structures. The magnitude of the compressive stress generated by the thermal silicon oxide liner 763 may be in a range from 1 MPa to 400 MPa, such as from 10 MPa to 200 MPa, although lesser and greater magnitudes of the compressive stress may also be employed. The magnitude of the tensile stress generated by the silicon nitride liner 762 can be less than the magnitude of the tensile stress originally generated by the in-process silicon nitride liner 762' prior to the thermal oxidation process.

In one embodiment, the thermal oxidation process can form a thin silicon oxynitride transition layer 764 between the thermal silicon oxide liner 763 and the silicon nitride liner 762. Within the thin transition layer, the atomic concentration of oxygen increases from the side of the silicon nitride liner 762 to the side of the thermal silicon oxide liner 763, and the atomic concentration of nitrogen atoms increases from the side of the thermal silicon oxide liner 763 to the side of the silicon nitride liner 762. As used herein, the transition layer 764 refers to a region in which the atomic concentration of oxygen atoms is less than 99% of the atomic concentration of oxygen in a bulk region of the thermal silicon oxide liner 763 (i.e., a region spaced from the interface with the silicon nitride liner 762 and is essentially free of nitrogen), and in which the atomic concentration of nitrogen atoms is less than 99% of the atomic concentration of nitrogen in a bulk region of the silicon nitride liner 762 (i.e., a region spaced from the thermal silicon oxide liner 763 and is essentially free of oxygen).

The composition of the bulk region of the thermal silicon oxide liner 763 can be $SiO_2$, and the composition of the bulk region of the silicon nitride liner 762 can be $Si_3N_4H_8$, or $SiN_{(4/3)}H_{(\delta/3)}$, in which $\delta$ is less than 0.1. The composition of the transition layer 764 at the interface between the silicon nitride liner 762 and the thermal silicon oxide liner 763 can be $SiO_{2-x}N_{(2x/3)}H_\epsilon$ in which the value of x changes from 0 to 2 and the value of c changes from 0 to $\delta$. The portion of the transition layer 764 in which the value of x is less than 1 is consisted to be a portion of the thermal silicon oxide liner 763, and the portion of the transition layer in which the value of x is greater than 1 is considered to be a portion of the silicon nitride liner 762. The thickness of the transition layer depends on the process parameters of the oxidation process, and may be in a range from 0.6 nm to 3 nm, although lesser and greater thicknesses can also be employed.

In contrast to the gradual change in composition between the silicon nitride liner 762 and the thermal silicon oxide liner 763, the interface between the silicon oxide liner 761 and the silicon nitride liner 762 can be an atomic interface, i.e., an interface between two atomic layers without interdiffusion of materials thereacross. In one embodiment, the compositional change across the interface between the silicon oxide liner 761 and the silicon nitride liner 762 can be within 0.6 nm corresponding to two atomic layers, and may be within 0.3 nm corresponding to one atomic layer.

Figure 4A:
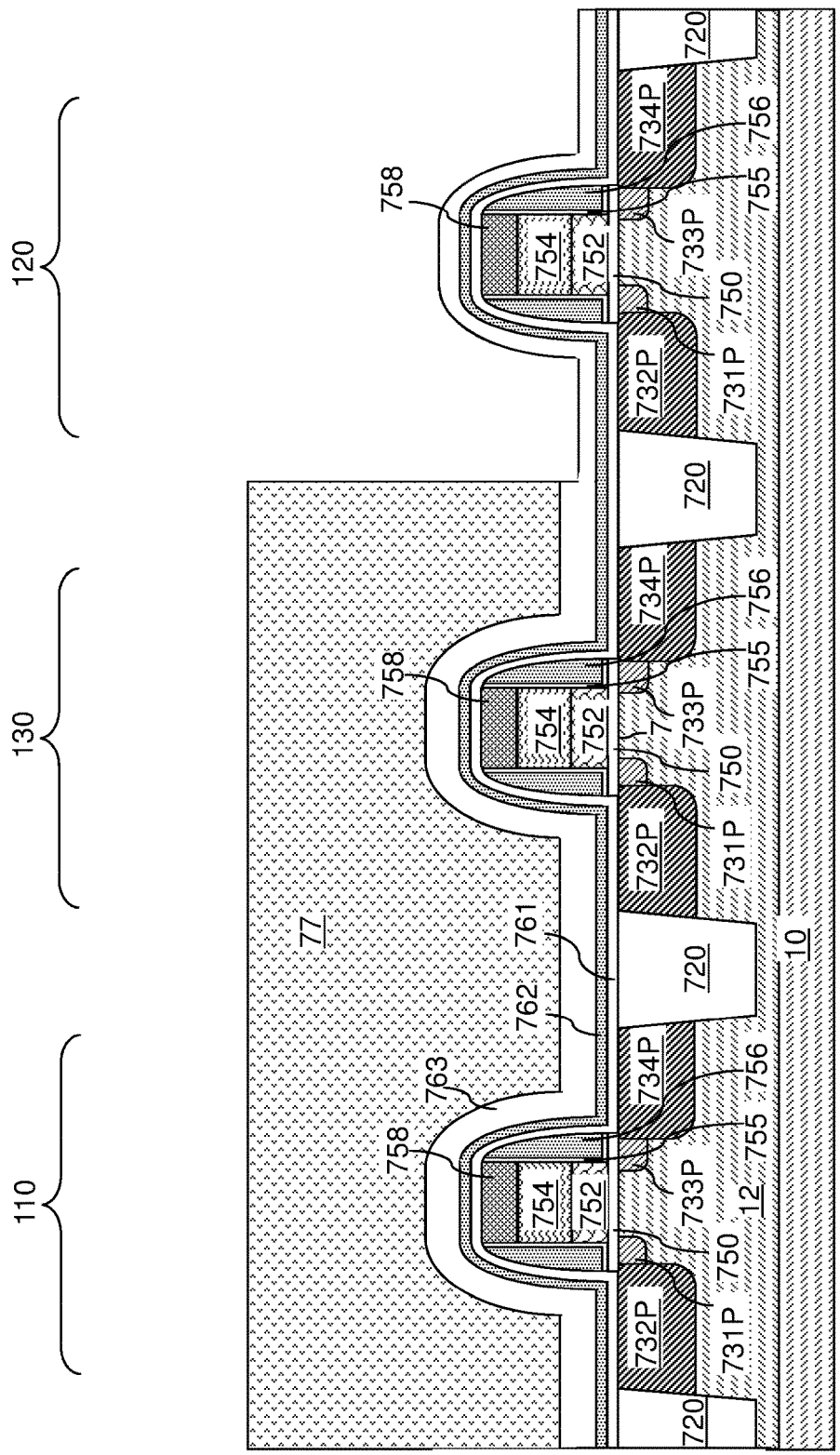
FIG. 4A is a vertical cross-sectional view of the first region of the exemplary semiconductor structure after application and first patterning of a positive tone photoresist layer and a first etch process according to an embodiment of the present disclosure.
Figure 4B:
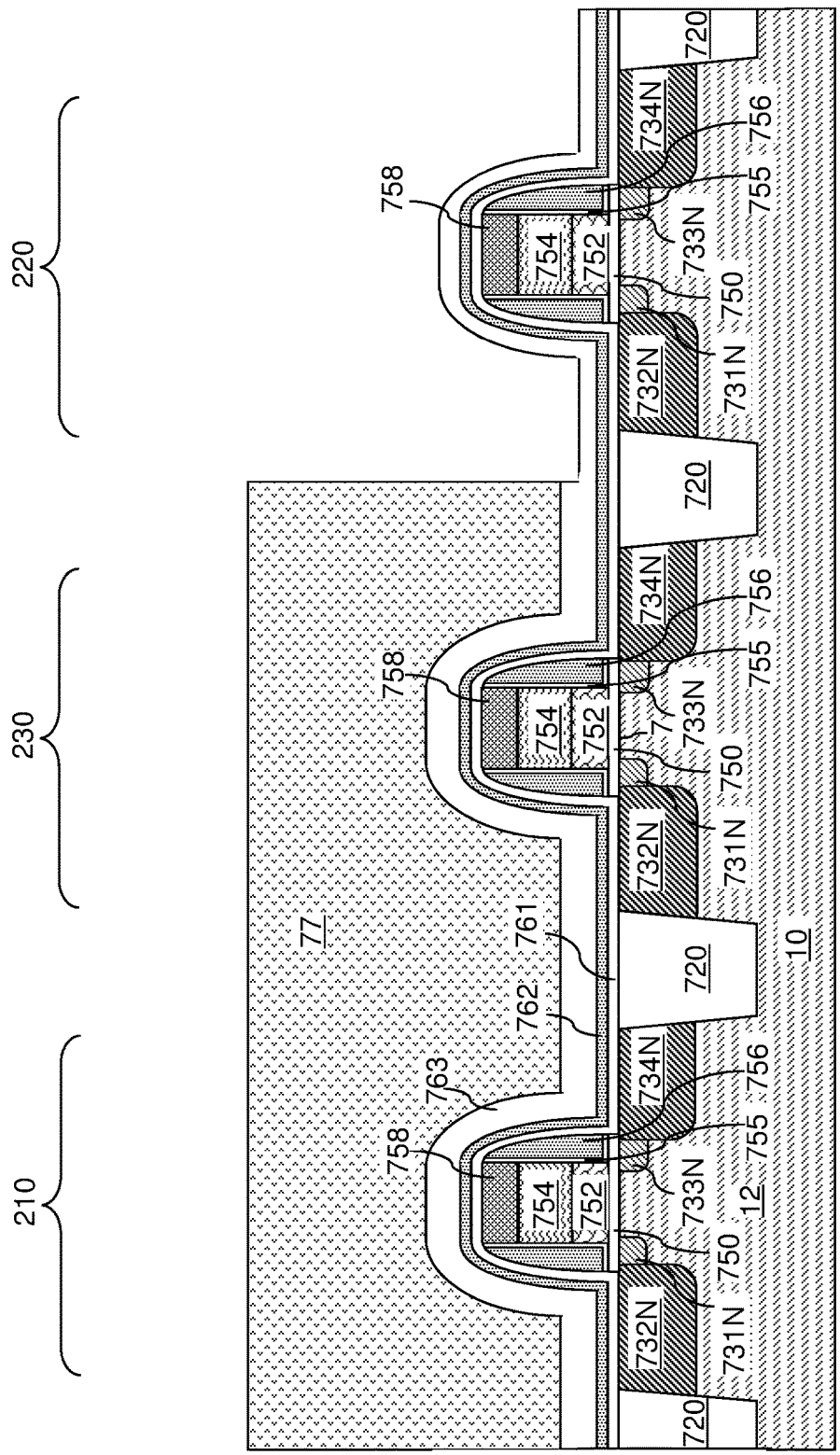
FIG. 4B is a vertical cross-sectional view of the second region of the exemplary semiconductor structure after application and first patterning of the positive tone photoresist layer and the first etch process according to an embodiment of the present disclosure.

Referring to FIGS. 4A and 4B, photoresist layer 77 can be applied over the exemplary structure, and can be lithographically patterned to cover the first p-type field effect transistor 110, the third p-type field effect transistor 130, the first n-type field effect transistor 210, and the third n-type field effect transistor 230, while not covering the second p-type field effect transistor 120 and the second n-type field effect transistor 220. The steps shown in FIGS. 4A and 4B are optional for the transistors 110 and 220 in the CMOS configuration shown in FIG. 1C.

A respective opening in the photoresist layer 77 overlies each of the second p-type field effect transistor 120 and the second n-type field effect transistor. The opening over the second p-type field effect transistor 120 may, or may not, be connected with the opening over the second n-type field effect transistor 220.

The photoresist layer 77 may be a positive tone photoresist layer or a negative tone photoresist layer. A positive tone photoresist layer is a layer of a positive tone photoresist material, i.e., a photoresist material that loses cross-linking upon exposure to radiation at an exposure wavelength (such as ultraviolet radiation) and becomes soluble in a solvent. A negative tone photoresist layer is a layer of a negative tone photoresist material, i.e., a photoresist material that forms cross-linking upon exposure to radiation at an exposure wavelength and becomes insoluble in a solvent. If the photoresist layer 77 is a positive tone photoresist layer, the photoresist layer 77 may be lithographically exposed multiple times to enable multiple patterning without re-application of another photoresist material. First portions of the thermal silicon oxide liner 763 are masked by the photoresist layer 77 and overlie the first p-type field effect transistor 110 or the first n-type field effect transistor 210, while second portions of the thermal silicon oxide liner 763 are physically exposed underneath the opening(s) in the photoresist layer 77 above the second p-type field effect transistor 120 or above the second n-type field effect transistor 220.

A first etch process is performed to etch the physically exposed portions (including the second portions) of the thermal silicon oxide liner 763 selective to silicon nitride of the silicon nitride liner 762 with a controlled etch rate. The first etch process can be a first isotropic or anisotropic etch process that etches the material of the thermal silicon oxide liner 763 selective to the silicon nitride liner 762. An etchant that etches the silicon oxide material of the thermal silicon oxide liner 763 can be employed in the first etch process. For example, the first etch process can be an isotropic wet etch process that employs dilute hydrofluoric acid as an etchant.

The duration of the first isotropic etch process and the dilution of the etchant can be selected such that a fraction, or all, of the second portions of the thermal silicon oxide liner 763 is etched during the first isotropic etch process. In one embodiment, the etch distance (i.e., the distance by which the etched portion of the thermal silicon oxide liner 763 is recessed) can be in a range from 10% to 100%, such as from 25% to 75%) of the thickness of horizontal portions of the thermal silicon oxide liner 763 as provided at the processing steps of FIGS. 3A and 3B. A fraction, or all, of the second portions of the thermal silicon oxide liner 763 is removed by the first etch process above the second p-type field effect transistor 120 and above the second n-type field effect transistor 220. The removed (etched) fraction corresponds to the volume of the second portions of the thermal silicon oxide liner 763 that is more proximal to the physically exposed surface of the thermal silicon oxide liner 763 as provided at the processing steps of FIGS. 4A and 4B than the etch distance of the first isotropic etch process.

Figure 5A:
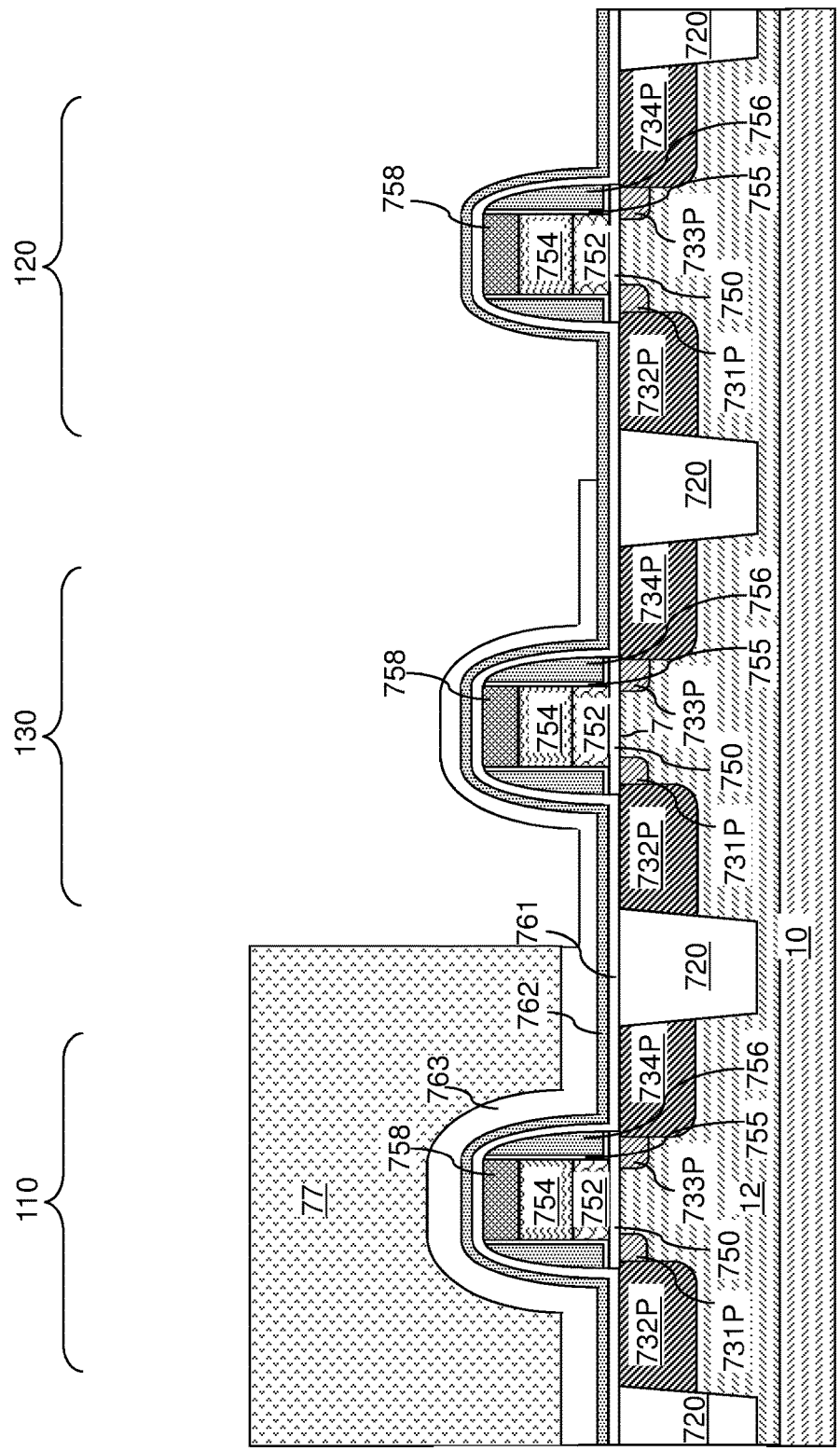
FIG. 5A is a vertical cross-sectional view of the first region of the exemplary semiconductor structure after second patterning of the positive tone photoresist layer and a second etch process according to an embodiment of the present disclosure.
Figure 5B:
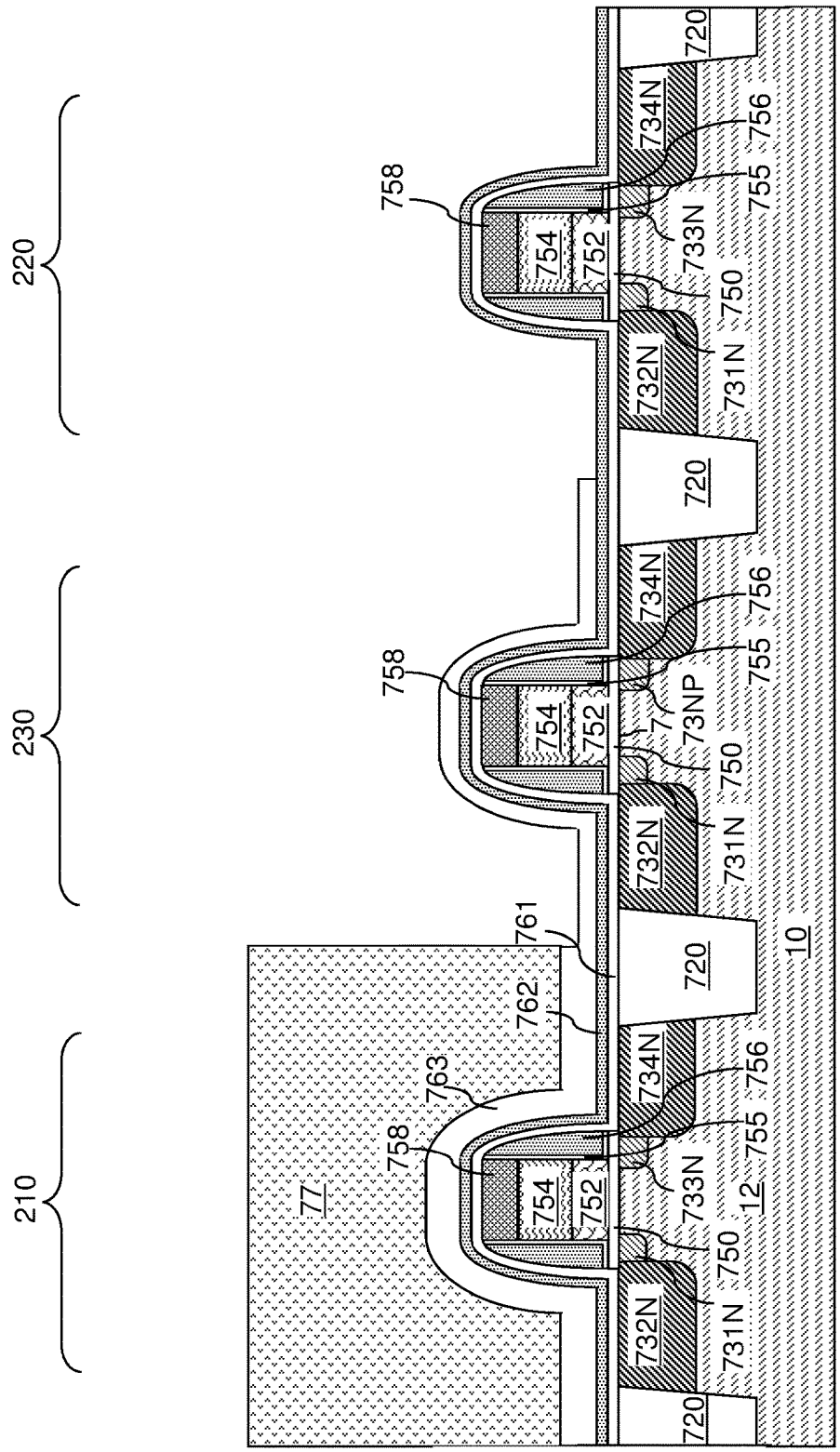
FIG. 5B is a vertical cross-sectional view of the second region of the exemplary semiconductor structure after second patterning of the positive tone photoresist layer and the second etch process according to an embodiment of the present disclosure.
Figure 5C:
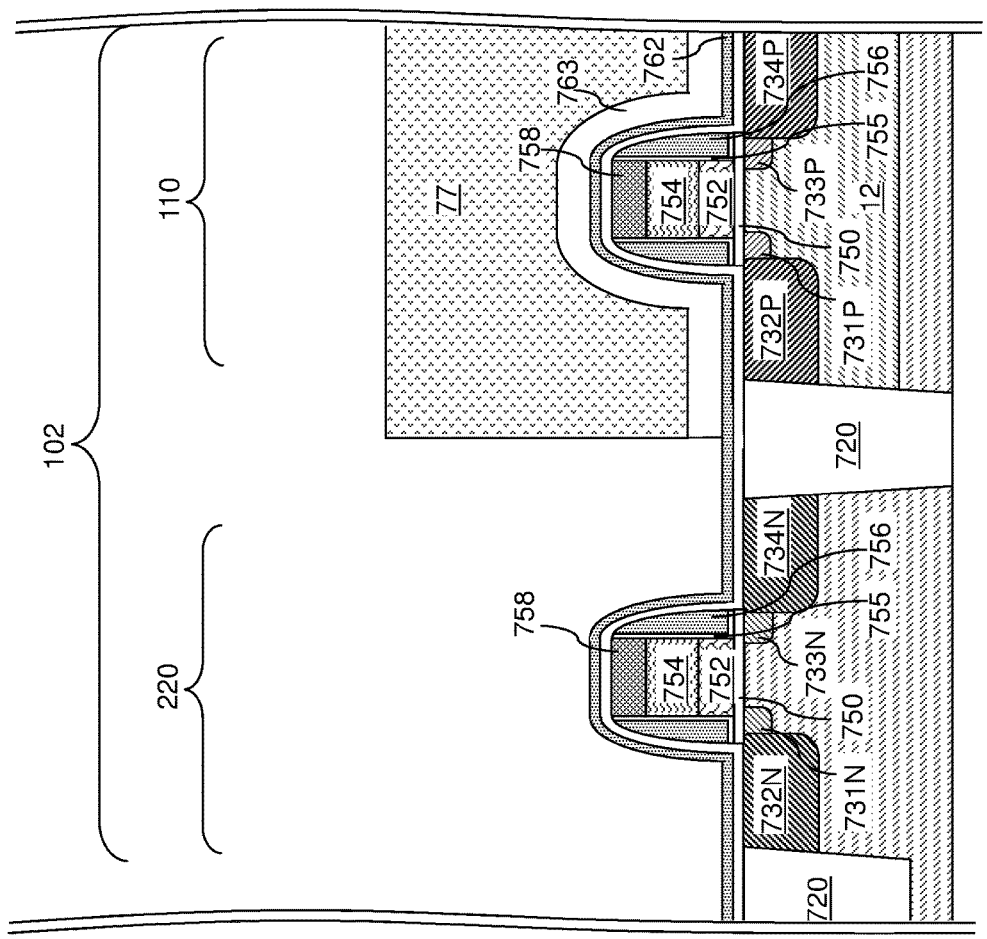
FIG. 5C is a vertical cross-sectional view of the first and second regions of the exemplary semiconductor structure in a CMOS configuration.

Referring to FIGS. 5A and 5B, the first p-type field effect transistor 110 and the first n-type field effect transistor 210 can be covered by an etch mask layer without covering the second and third p-type field effect transistors (120, 130) or the second and third n-type field effect transistors (220, 230). In the CMOS device 102 embodiment shown in FIG. 5C, the etch mask covers the p-type transistor 110 without covering the n-type transistor 220.

In case the photoresist layer 77 including a positive tone photoresist material is used as the etch mask, then portions of the photoresist layer 77 overlying the optional second p-type field effect transistor 120 and/or the second n-type field effect transistor 220 are lithographically exposed and developed so that the remaining portions of the photoresist layer 77 cover the first p-type field effect transistor 110 and optional the first n-type field effect transistor 210, while the optional second and third p-type field effect transistors (120, 130) and the second n-type field effect transistor 220 and the optional third n-type field effect transistor 230 are not covered by the photoresist layer 77. In this case, the positive tone photoresist layer can be patterned (e.g., again if the steps of FIGS. 4A and 4B are performed) by lithographically exposing and developing lithographically exposed portions of the positive tone photoresist layer overlying the second p-type field effect transistor and the second n-type field effect transistor (e.g., the n-type transistor 220 in the CMOS device 102). In one embodiment, the at least one opening in the positive tone photoresist layer that overlies the optional second p-type field effect transistor 120 and the second n-type field effect transistor 220 can be expanded to the optional third p-type field effect transistor 130 and the optional third n-type field effect transistor 230. Alternatively, at least another opening overlying the third p-type field effect transistor 130 and/or the third n-type field effect transistor 230 can be formed through the positive tone photoresist layer.

Alternatively, the photoresist layer 77 may be removed, for example, by ashing, and another photoresist layer may be applied and patterned to cover the first p-type field effect transistor 110 and the first n-type field effect transistor 210 and without covering the second and third p-type field effect transistors (120, 130) or the second and third n-type field effect transistors (230, 240). In the CMOS device 102 shown in FIG. 5C, an initial photoresist layer 77 may be formed and patterned to remain over the p-type transistor 110 while exposing the n-type transistor 220.

Any unetched remainder of the second portions of the thermal silicon oxide layer 763 is physically exposed underneath the opening(s) in the etch mask layer (which may be a remaining portion of the photoresist layer 77) overlying the second p-type field effect transistor 120 or the second n-type field effect transistor 220. In addition, additional portions of the thermal silicon oxide layer 763 are physically exposed underneath the opening(s) in the etch mask layer (which may be a remaining portion of the photoresist layer 77) overlying the third p-type field effect transistor 130 or the third n-type field effect transistor 230.

A second etch process is performed to etch the physically exposed portions of the thermal silicon oxide liner 763 selective to silicon nitride of the silicon nitride liner 762 with a controlled etch rate. The second etch process can be a second isotropic etch process that etches the material of the thermal silicon oxide liner 763 isotropically. An isotropic etchant that etches the silicon oxide material of the thermal silicon oxide liner 763 can be employed can be employed in the second isotropic etch process. The isotropic etchant of the second etch process may be the same as the isotropic etchant of the first etch process. For example, the second isotropic etch process can be a wet etch process that employs dilute hydrofluoric acid as an etchant.

The duration of the second isotropic etch process and the dilution of the etchant can be selected such that a fraction, but not all, of the physically exposed portions of the thermal silicon oxide liner 763 overlying the optional third p-type field effect transistor 130 or the optional third n-type field effect transistor 230 is etched during the second isotropic etch process. Third portions of the thermal silicon oxide liner 763 are removed from above the second p-type field effect transistor 120 and from above the second n-type field effect transistor 220. The removed third portions have a lesser thickness than the first portions of the thermal silicon oxide liner 763 that are present underneath the etch mask layer (such as the photoresist layer 77) above the first p-type field effect transistor 110 and above the first n-type field effect transistor 210. Fourth portions (which are unetched portions) of the thermal silicon oxide liner 763 remain above the third p-type field effect transistor 130 and above the third n-type field effect transistor 230.

In one embodiment, the etch distance (i.e., the distance by which the etched portion of the thermal silicon oxide liner 763 is recessed) can be in a range from 10% to 90%, such as from 25% to 75%) of the thickness of horizontal portions of the thermal silicon oxide liner 763 as provided at the processing steps of FIGS. 3A and 3B (which is the same as the thickness of the first portions of the thermal silicon oxide liner 763 under the etch mask layer). Any remaining fraction of the second portions of the thermal silicon oxide liner 763, if present, can be removed by the second etch process. The removed third portions correspond to the volumes of the unmasked portions of the thermal silicon oxide liner 763 that are more proximal to the physically exposed surface of the thermal silicon oxide liner 763 before the beginning of the second isotropic etch process than the etch distance of the second isotropic etch process. A top surface of the silicon nitride liner 762 is physically exposed above the second p-type field effect transistor 120 and above the second n-type field effect transistor 220.

Figure 6A:
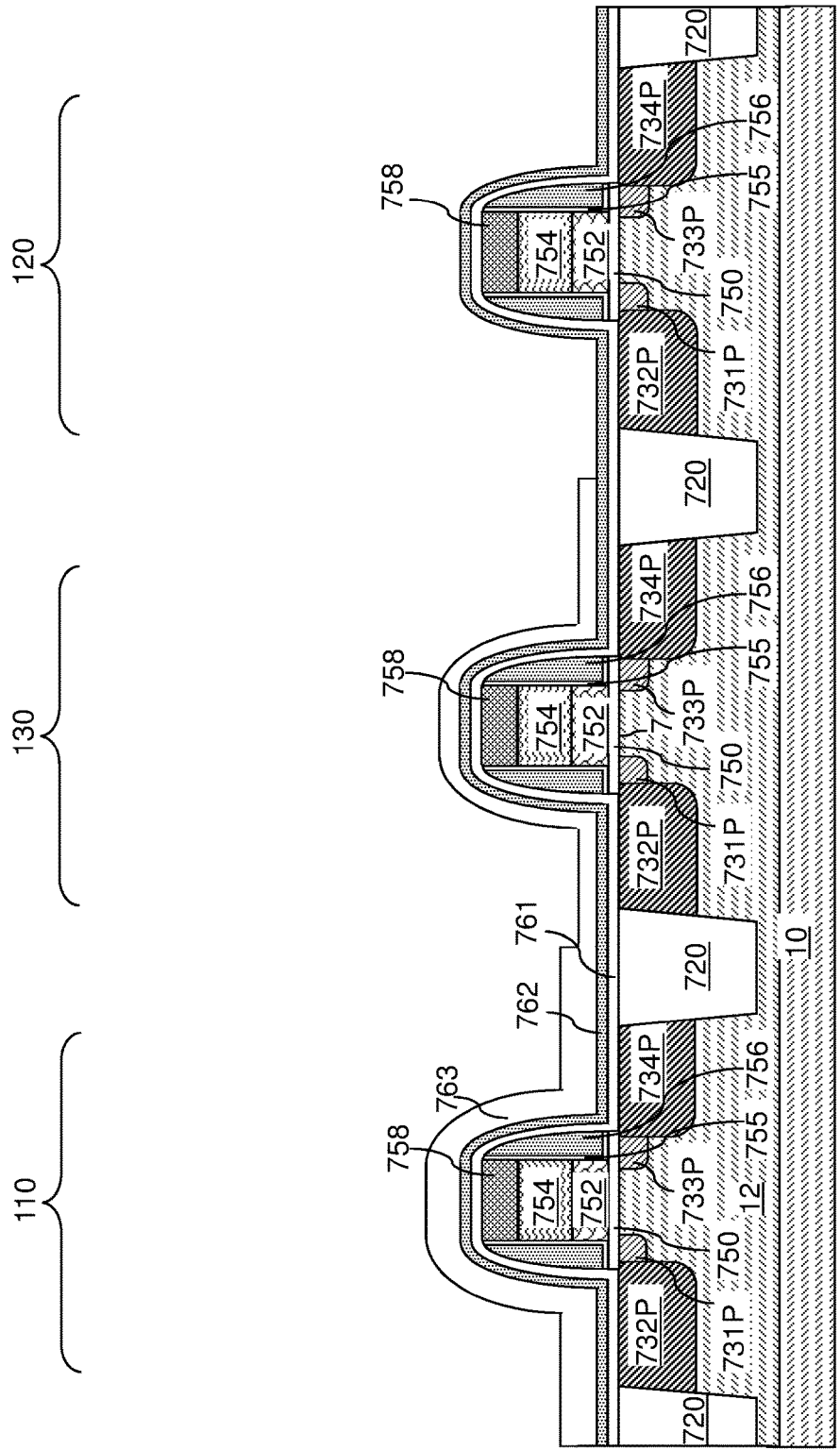
FIG. 6A is a vertical cross-sectional view of the first region of the exemplary semiconductor structure after removal of the positive tone photoresist layer according to an embodiment of the present disclosure.
Figure 6B:
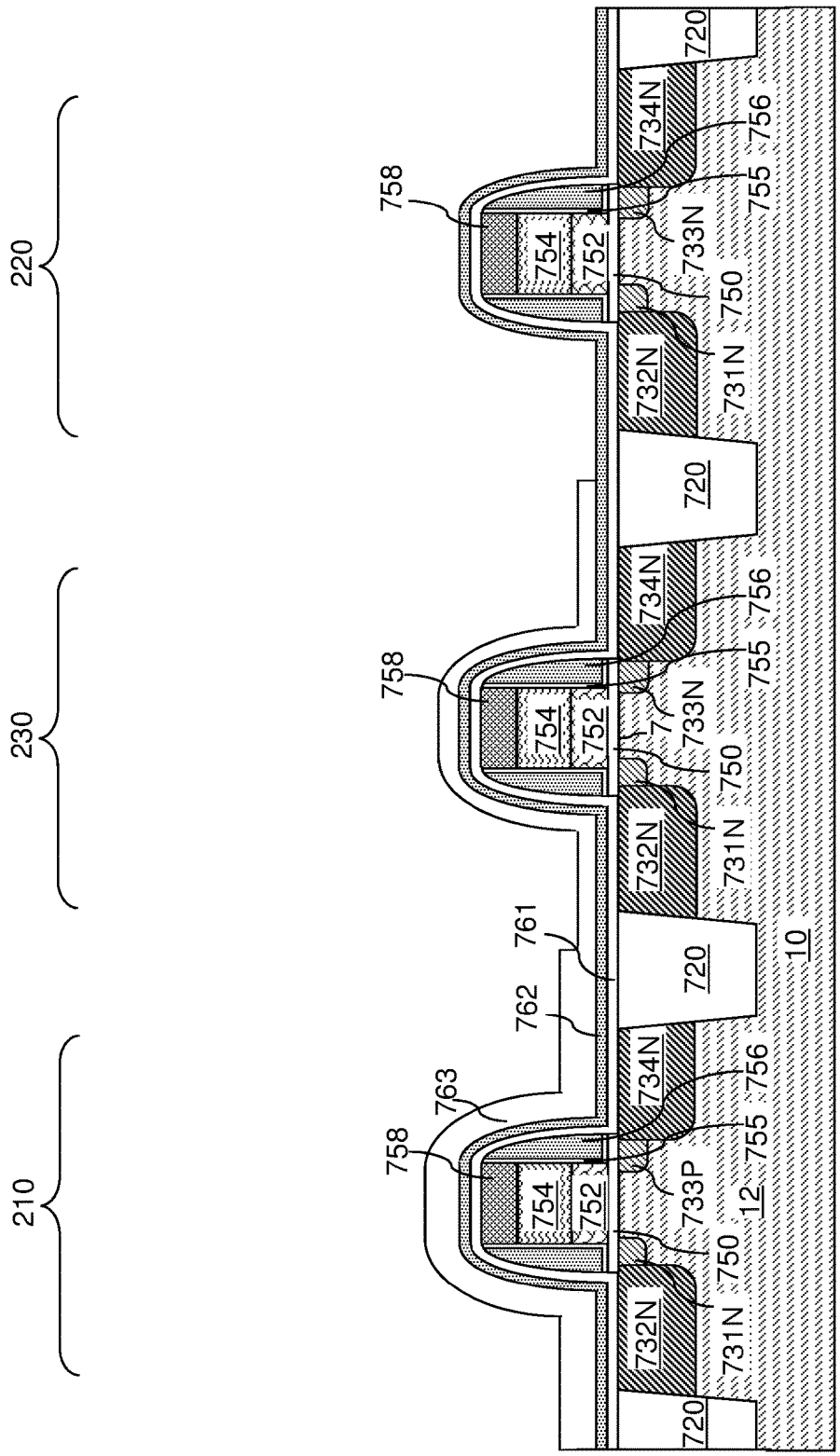
FIG. 6B is a vertical cross-sectional view of the second region of the exemplary semiconductor structure after removal of the positive tone photoresist layer according to an embodiment of the present disclosure.
Figure 6C:
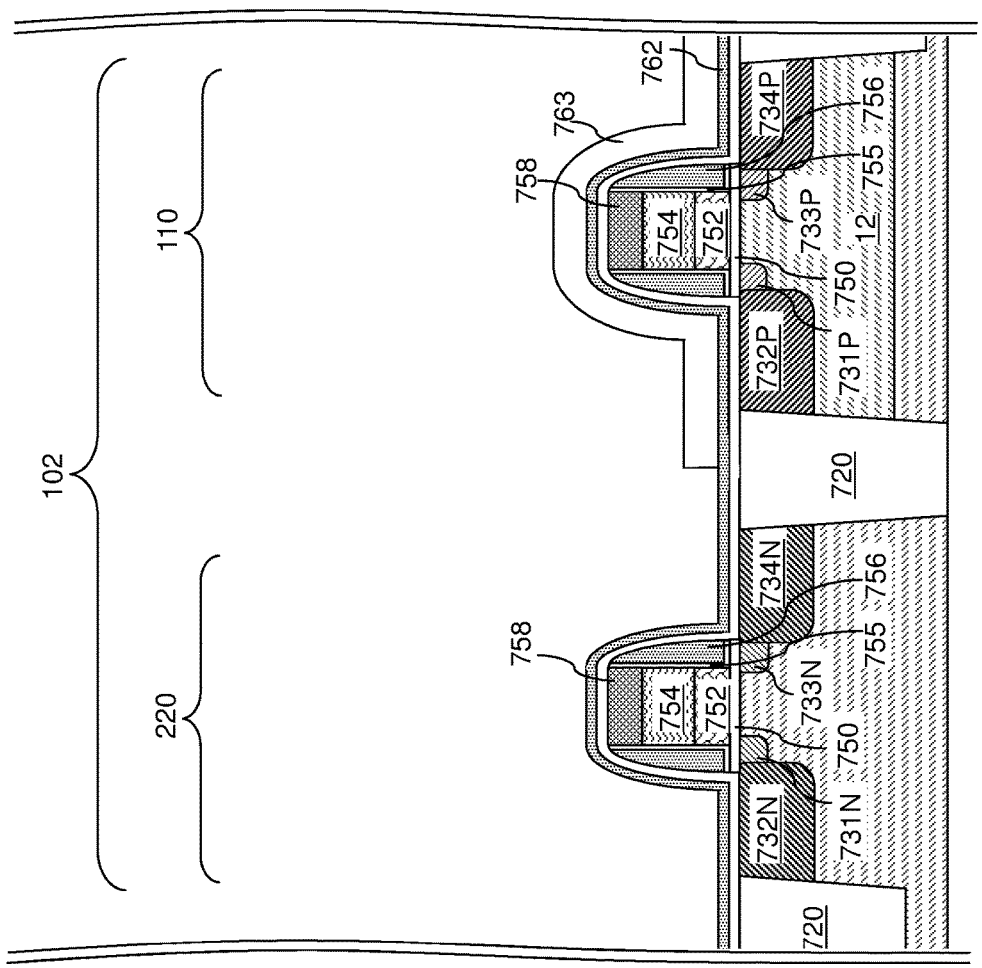
FIG. 6C is a vertical cross-sectional view of the first and second regions of the exemplary semiconductor structure in a CMOS configuration.

Referring to FIGS. 6A and 6B, the photoresist layer 77 (which may be a positive tone photoresist layer) can be removed by ashing. The remaining portions of the thermal silicon oxide liner 763 can have different thicknesses across the region of the first p-type field effect transistor 110 and the region of the third p-type field effect transistor 130. Further, the remaining portions of the thermal silicon oxide liner 763 can have different thicknesses across the region of the first n-type field effect transistor 210 and the region of the third n-type field effect transistor 230. The thermal silicon oxide liner 763 is not present over the second p-type field effect transistor 120 or the second n-type field effect transistor 220. A top surface of the silicon nitride liner 762 is physically exposed over the second p-type field effect transistor 120 and the second n-type field effect transistor 220. In the CMOS device 102 shown in FIG. 6C, the thermal silicon oxide liner 763 is present over the p-type transistor 110 but is not present over the n-type transistor 220.

Figure 7A:
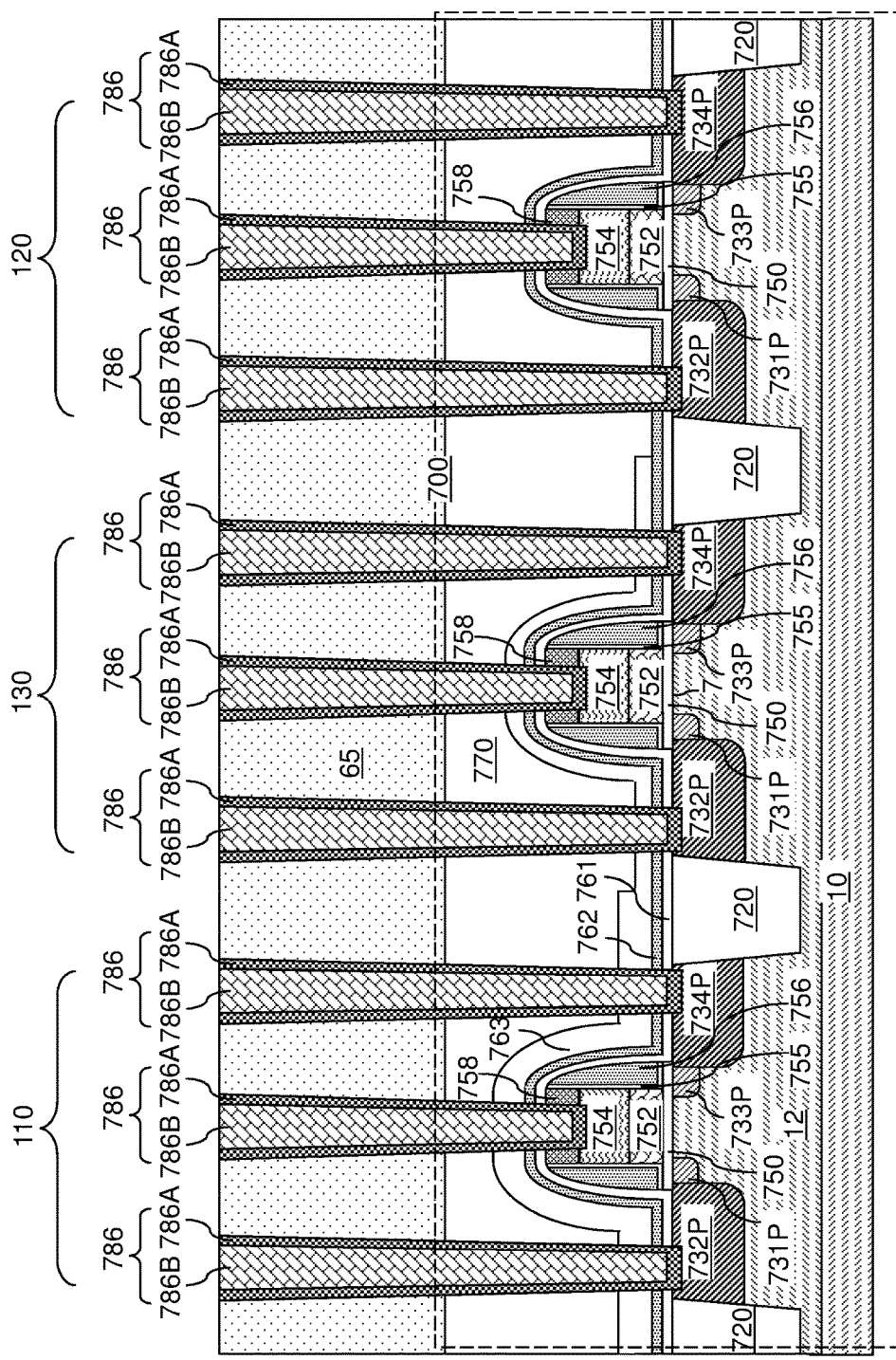
FIG. 7A is a vertical cross-sectional view of the first region of the exemplary semiconductor structure after formation of a planarization dielectric layer, a contact dielectric layer, and various contact via structures according to an embodiment of the present disclosure.
Figure 7B:
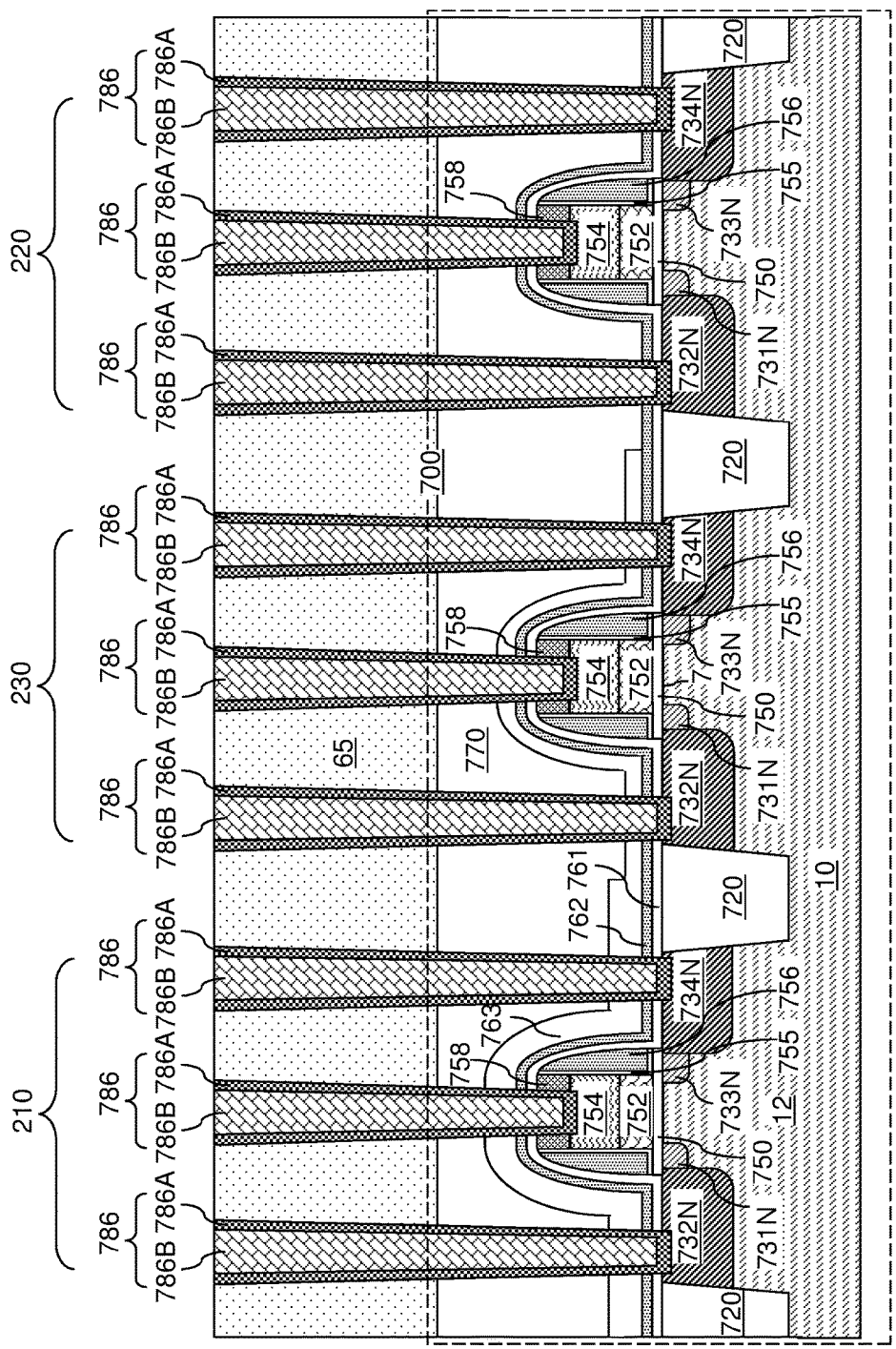
FIG. 7B is a vertical cross-sectional view of the second region of the exemplary semiconductor structure after formation of the planarization dielectric layer, the contact dielectric layer, and the various contact via structures according to an embodiment of the present disclosure.

Referring to FIGS. 7A and 7B, a dielectric material is subsequently deposited over the silicon nitride liner 762 and the thermal silicon oxide liner 763. The deposited dielectric material is herein referred to as a planarization dielectric material. The planarization dielectric material includes a planarizable dielectric material such as undoped silicate glass or doped silicate glass. Alternatively, the planarization dielectric material can include a self-planarizing dielectric material such as spin-on glass (SOG). A planar top surface of the dielectric material is provided by a planarization process such as chemical mechanical planarization, or by self-planarizing property of the dielectric material. The layer of planarization dielectric material is herein referred to as a planarization dielectric layer 770. In case the planarization dielectric material includes deposited or spin-coated silicon oxide material, the planarization dielectric layer 770 includes typical impurities contained in a deposited silicon oxide material. For example, the planarization dielectric layer 770 can include hydrogen atoms at an atomic concentration greater than 3 part per million and carbon atoms at an atomic concentration greater than 1 part per million, which can be caused by incorporation of impurities during thermal decomposition of tetraethylorthosilicate (TEOS) or by incorporation of a residual solvent material during application of a spin-on-glass material.

A contact level dielectric layer 65 can be deposited over the planarization dielectric layer 770. The contact level dielectric layer 65 can include a second silicate glass material, which may, or may not, be the same as the planarization dielectric material. For example, contact level dielectric layer 65 can include undoped silicate glass (e.g., silicon oxide) formed by decomposition of TEOS in a low pressure chemical vapor deposition (LPCVD) process. This layer can be annealed to increase its density (i.e., to form a so-called densified TEOS oxide). Alternatively, the contact level dielectric layer 65 can include doped silicate glass (such as borophosphosilicate glass, borosilicate glass, phosphosilicate glass, or arsenosilicate glass), or porous or non-porous organosilicate glass. The thickness of the contact level dielectric layer 65 can be in a range from 100 nm to 600 nm, although lesser and greater thicknesses can also be employed.

A photoresist layer can be applied over the contact level dielectric layer 65, and can be lithographically patterned to form contact openings in areas in which contact via structures are to be subsequently formed. For example, openings can be formed in areas of the p-doped active regions (732P, 734P), the n-doped active regions (732N, 734N), and the gate electrodes (752, 754) of the various field effect transistors (110, 120, 130, 210, 220, 230). Various contact via cavities can be formed by anisotropically etching portions of the contact level dielectric layer 65, the planarization dielectric layer 770, the thermal silicon oxide liner 763, the silicon nitride liner 762, the silicon oxide liner 761, and the gate cap dielectric portions 758. The various contact via cavities can be simultaneously formed by an anisotropic etch process that employs the photoresist layer as an etch mask. The various contact via cavities include p-type active region via cavities that are formed over the p-doped active regions (732P, 734P), n-type active region via cavities that are formed over the n-doped active regions (732N, 734N), and gate contact via cavities that are formed over the gate electrodes (752, 754).

The photoresist layer can be removed from above the contact level dielectric layer 65, for example, by ashing. Various contact via structures 786 are formed in the various via cavities by deposition of at least one conductive material therein. For example, a metallic barrier material such as titanium, TiN, TaN, and/or WN can be deposited in the various via cavities. Subsequently, a metallic fill material such as W, Cu, Al, Ru, Co, and/or Mo can be deposited in remaining volumes of the various via cavities. Excess portions of the metallic fill material and the metallic barrier material can be removed from above the horizontal plane including the top surface of the contact level dielectric layer 65 by a planarization process such as chemical mechanical planarization. Each remaining portion of the metallic barrier material constitutes a metallic barrier liner 786A. Each remaining portion of the metallic fill material constitutes a metallic fill material portion 786B. Each adjoining pair of a metallic barrier liner 786A and a metallic fill material portion 786B constitutes a contact via structure 786.

The contact via structures 786 include first active region contact via structures (e.g., source and drain electrodes) that are formed directly on a respective one of the p-doped active regions (732P, 734P), second active region contact via structures (e.g., source and drain electrodes) that are formed directly on a respective one of the n-doped active regions (732N, 734N), and gate contact via structures (e.g., gate contacts) that are formed directly on a respective one of the gate electrodes (752, 754). The p-type field effect transistors (110, 120, 130), the n-type field effect transistor (210, 220, 230), the silicon oxide liner 761, the silicon nitride liner 762, the thermal oxide silicon oxide liner 763, and the planarization dielectric layer 770 can be components of driver circuitry 700, which can be employed to support operation of a memory device such as a three-dimensional memory device.

In one embodiment, the low voltage p-type field effect transistors 110 can have a thicker compressive stress liner 763 than the intermediate and high voltage p-type field effect transistors (130, 120), since a higher performance (e.g., on-current) is desired for the low voltage p-type field effect transistors 110.

In another embodiment, the transistors (110, 120, 130) comprise the same voltage and same conductivity type Vdd transistors with different device characteristics (e.g., threshold voltage, on-current and/or a ratio of threshold voltage to on-current) from each other. In this embodiment, the different transistor characteristics can be obtained without resorting to additional selective threshold voltage adjustment ion implants into some but not all channels and/or making gate dielectrics 750 with a different thickness from each other. Such transistors can be used in an SRAM memory device, for example.

The CMOS device 102 can be a part of the driver circuitry 700 for a memory device and may contain the same conductive and dielectric materials as those shown for transistors 110 and 220 in FIGS. 7A and 7B. The n-type transistors 220 are under tensile stress from the silicon nitride liner 762 while the p-type transistors 110 are under compressive stress from the silicon oxide liner 763, which improves the transistor performance of both types of transistors (110, 120).

Figure 8:
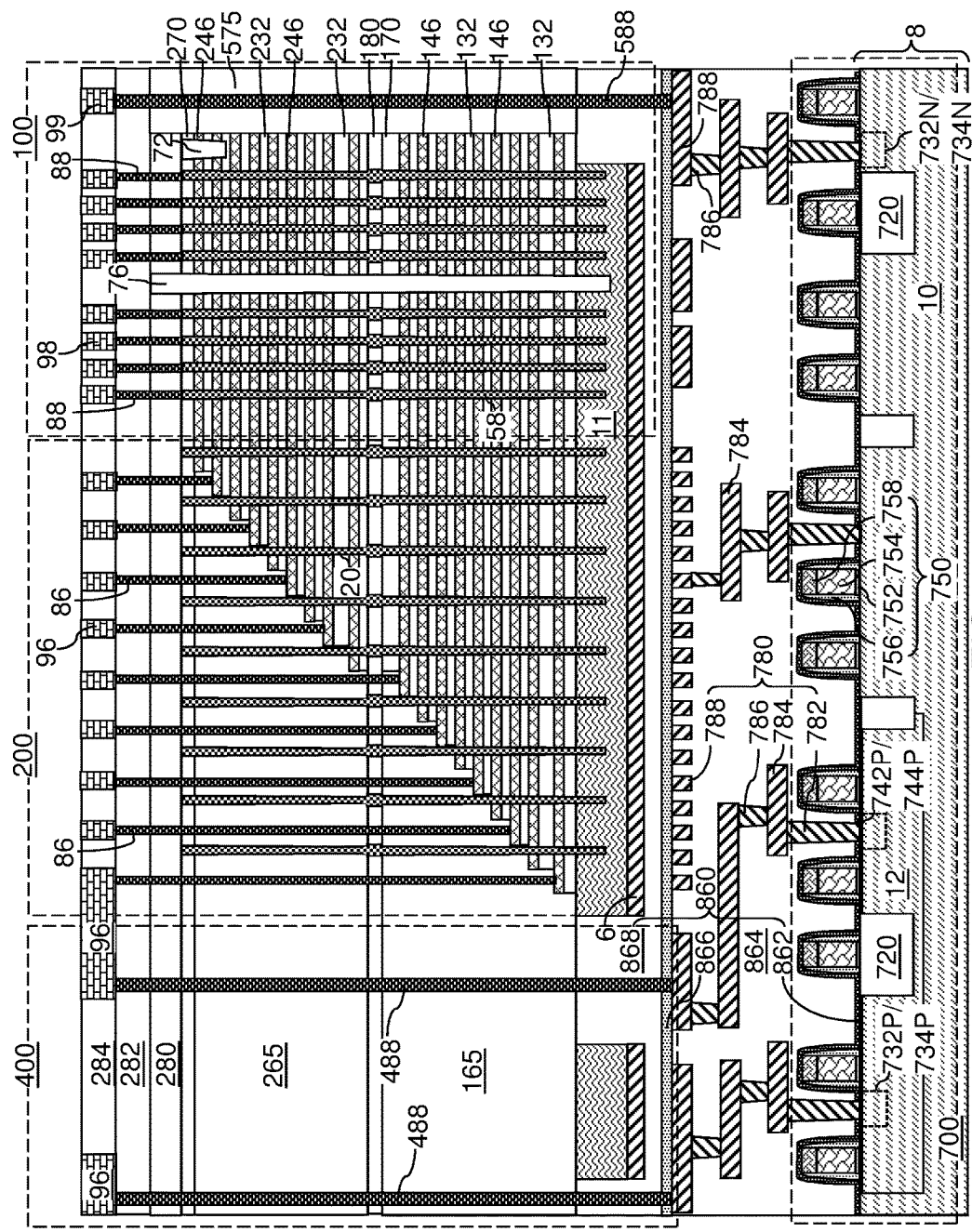
FIG. 8 is a vertical cross-sectional view of the exemplary structure after formation of a three-dimensional array of memory elements thereupon according to an embodiment of the present disclosure.

Referring to FIG. 8, the exemplary structure is illustrated after formation of a three-dimensional memory array over the field effect transistors. The various field effect transistors on the semiconductor substrate 8 can include multiple instances of the p-type field effect transistors (110, 120, 130) and multiple instances of the n-type field effect transistors (210, 220, 230) described above. In other words, the transistors may comprise high, low and optionally intermediate voltage transistors, and/or same voltage transistors with different device characteristics and/or p-type and n-type transistors in a CMOS configuration. The semiconductor gate electrode portions 752 may be p-doped or n-doped as needed. The silicon oxide liner 761, the silicon nitride liner 762, and the thermal silicon oxide liner 763 are herein collectively referred to dielectric liners 862.

Additional dielectric material layers can be formed over the exemplary structure. The dielectric liners 862, the planarization silicon oxide layer 770, the contact level dielectric layer 65, and the additional dielectric layers are herein collectively referred to as lower-level dielectric material layers 860. The lower-level dielectric material layers 860 can include, for example, the dielectric liners 862, first dielectric material layer 864 that include the planarization silicon oxide layer 770, the contact level dielectric layer 65, and a first subset of the additional dielectric layers, a dielectric diffusion barrier layer 866 (such as a silicon nitride layer) that overlies the first dielectric material layers 864, and at least one second dielectric layer 868 that overlies the dielectric diffusion barrier layer 866.

Lower-level metal interconnect structures 780 can be formed within lower-level dielectric material layers 860 level by level. The lower-level metal interconnect structures 780 can include the various contact via structures 782, various intermediate-level metal line structures 784, various metal via structures 786, and various top-level metal line structures 788. The dielectric diffusion barrier layer 866 and the at least one second dielectric layer 868 can be formed over the lower-level metal interconnect structures 780.

An optional layer of a metallic material and a layer of a semiconductor material can be deposited over, or within patterned recesses of, the at least one second dielectric material layer 868, and is lithographically patterned to provide an optional conductive plate layer 6 and source-level material layers 11. At least one alternating stack of insulating layers (132, 232) and spacer material layers can be formed and patterned to form stepped surfaces in a staircase region 200. A memory array region 100, in which each of the at least one alternating stack includes each layer therein, is provided adjacent to the staircase region. The spacer material layers can be formed as electrically conductive layers (146, 246), or can be formed as sacrificial material layers and can be subsequently replaced with electrically conductive layers (146, 246). For example, the at least one alternating stack can include a first alternating stack of first insulating layers 132 and first electrically conductive layers 146 and a second alternating stack of second insulating layers 232 and second electrically conductive layers 246. Retro-stepped dielectric material portions (165, 265) can be formed over the stepped surfaces. For example, a first retro-stepped dielectric material portion 165 can be formed over the first stepped surfaces of the first alternating stack (132, 146), and a second retro-stepped dielectric material portion 265 can be formed over the second stepped surfaces of the second alternating stack (232, 246). Intermediate dielectric material layers can be formed as needed. For example, the intermediate dielectric material layers can include a first insulating cap layer 170, an inter-tier dielectric layer 180, and a second insulating cap layer 270. Drain-select-level isolation structures 72 can be formed as needed.

Memory openings are formed through each layer in the at least one alternating stack (132, 146, 232, 246) in the memory array region 100, and are filled within memory opening fill structures 58. Each memory opening fill structure 58 includes a memory stack structure. Each memory stack structure can include a memory film and a vertical semiconductor channel laterally surrounded by the memory film. For example, each memory film can include a blocking dielectric, a charge storage layer, and a tunneling dielectric. Support openings in the staircase region 200 are filled with support pillar structures 20 which have the same composition and structure as the memory opening fill structures 58. Backside trenches can be formed through the at least one alternating stack (132, 146, 232, 246) to divide the at least one alternating stack (132, 146, 232, 246) into multiple memory blocks that are laterally spaced apart and electrically isolated among one another. A dielectric wall structure 76 can be formed within each backside trench. Dielectric pillar structures 575 can be optionally formed in the memory array region 100.

Various contact-level dielectric layers (280, 282) can be formed over the at least one alternating stack (132, 146, 232, 246). The various contact-level dielectric layers (280, 282) can include a first contact-level dielectric layer 280 and a second contact-level dielectric layer 282. Various upper-level contact via structures can be formed through the contact-level dielectric layers (280, 282) and underlying dielectric material portions. The upper-level contact via structures can include staircase region contact via structures 86 that contact a respective one of the first and second electrically conductive layers (146, 246), drain contact via structures 88 that contact a respective drain region (not expressly shown) at an upper end of an underlying memory stack structure, through-memory-level peripheral contact via structures 488 that contact a respective one of the lower-level metal interconnect structures 780 in a peripheral contact region 400, and through-memory-level array-region contact via structures 588 that extend through a respective dielectric pillar structures 575 and contact a respective one of the lower-level metal interconnect structures 780 in the memory array region 100.

A line-level dielectric layer 284 can be formed over the contact-level dielectric layers (280, 282). Upper metal line structures (96, 98, 99) can be formed in the line-level dielectric layer 284. The upper metal liner structures (96, 98, 99) can include peripheral interconnection line structures 96 that contact at least one of the staircase region contact via structures 86 and the through-memory-level peripheral contact via structures 488, bit lines 98 that contact a respective subset of the drain contact via structures 88, and array-region interconnection line structures 99 that contact a respective one of the through-memory-level array-region contact via structures 588.

The different combinations of thicknesses of the silicon oxide liner 763 (including the thickness of zero over the second p-type field effect transistor 120 and the second n-type field effect transistor 220) and the silicon nitride liner 762 provide different levels and/or types of stress to underlying structures including the respective channels of the field effect transistors. The different levels and/or types of stresses generated by the different combinations of thicknesses of the silicon nitride liner 762 and the thermal silicon oxide liner 763 can be advantageously employed to tune the stress in the semiconductor channels of the field effect transistors to optimal levels. Two or three types of stress can be generated for the channels of the field effect transistors by employing the combination of complete removal of a portion of the thermal silicon oxide liner 763, optional partial removal of a portion of the thermal silicon oxide liner 763, and non-removal of a portion of the thermal silicon oxide liner 763. In case additional etch steps are employed to provide two or more levels of partial etching of the thermal silicon oxide liner 763, four or more types of stress can be generated for the channels of the field effect transistors, and mechanical stress and charge carrier mobility can be optimized for multiple types of field effect transistors.

Figure 9:
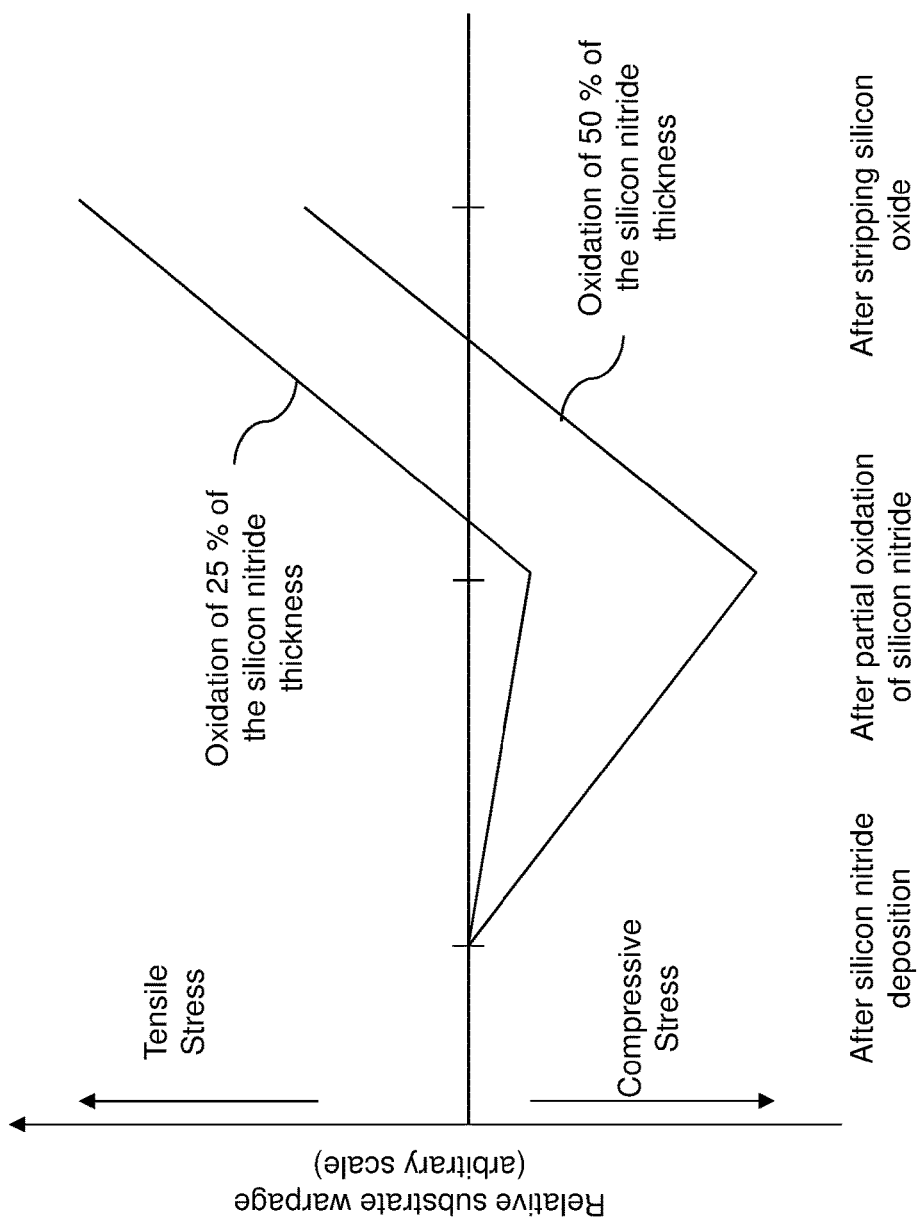
FIG. 9 is schematic illustration of changes in the external stress in the channels of field effect transistors of the present disclosure after formation of a silicon nitride liner, after formation of a silicon oxide liner, and after removal of the silicon oxide liner according to an embodiment of the present disclosure.

FIG. 9 illustrates changes in the external stress in the channels of field effect transistors (110, 220) of the CMOS device 102 of embodiments of the present disclosure after formation of an in-process silicon nitride liner 762', after formation of a stack of a silicon nitride liner 762 and a thermal silicon oxide liner 763, and after complete removal of the silicon oxide liner 763 over the n-type transistor (i.e., NMOS) 220. The case of thermal oxidation of 25% of the thickness of the in-process silicon nitride liner 762' and the case of the thermal oxidation of 50% of the thickness of the in-process silicon nitride liner 762' are illustrated. Generally, the parameters that can be employed to adjust the level of stress among the two or more types of thickness combinations of the silicon nitride liner 762 and a remaining portion (or a non-existent portion) of the thermal silicon oxide liner 763 include: the thickness of the in-process silicon nitride liner 762', the composition (including the hydrogen content) of the in-process silicon nitride liner 762', the volume percentage of the portion of the in-process silicon nitride liner 762' that is converted into a thermal silicon oxide liner 763, and the thickness of any remaining portion (or absence of any remaining portion) of the thermal silicon oxide liner 763 after the last masked etch process that removes selected portions of the thermal silicon oxide liner 763.

In one embodiment, the variations in the combinations of the thicknesses of the silicon nitride liner 762 and the thermal silicon oxide liner 763 can occur among p-type field effect transistors (110, 120, 130). In another embodiment, the variations in the combinations of the thicknesses of the silicon nitride liner 762 and the thermal silicon oxide liner 763 can occur among n-type field effect transistors (210, 220, 230). In yet another embodiment, the variations in the combinations of the thicknesses of the silicon nitride liner 762 and the thermal silicon oxide liner 763 can occur among at least one p-type field effect transistor 110 and at least one n-type field effect transistor 220. For example, an instance of the first p-type field effect transistor 110 can be employed to minimize the impact of the tensile stress generated by the silicon nitride liner 762 and to maximize the impact of the compressive stress generated by the thermal silicon oxide liner 763, and an instance of the second n-type field effect transistor 220 can be employed to maximize the impact of the tensile stress generated by the silicon nitride liner 762 and to minimize the impact of the compressive stress generated by the thermal silicon oxide liner 763. In another embodiment, an instance of the third p-type field effect transistor 130 and/or an instance of the third n-type field effect transistor 230 can be employed to provide stress to a respective underlying channel at a level that is less tensile than the stress in the channel of the second n-type field effect transistor 220 and is more tensile than the stress in the channel of the first p-type field effect transistor 110.

Referring to all drawings and according to various embodiments of the present disclosure, a semiconductor structure is provided, which comprises: a first field effect transistor (110, 210) and a second field effect transistor (120, 220) located on a substrate (10, 12); a silicon nitride liner 762 continuously extending over the first field effect transistor (110, 210) and the second field effect transistor (120, 220); a thermal silicon oxide liner 763 extending over the first field effect transistor (110, 210) and not extending over the second field effect transistor (120, 220); and a planarization dielectric layer 770 contacting the thermal silicon oxide liner 763 over the first field effect transistor (110, 210) and contacting the silicon nitride liner 762 over the second field effect transistor (120, 220).

In one embodiment, an interface between the silicon nitride liner 762 and the thermal silicon oxide liner 763 comprises a silicon oxynitride transition layer 764 which has a compositional gradient such that atomic concentration of nitrogen atoms increases with a nitrogen concentration gradient from a side of the thermal silicon oxide liner 763 to a side of the silicon nitride liner 762 over a distance of at least 0.6 nm (which may be at least 1.0 nm), and atomic concentration of oxygen atoms increases with an oxygen concentration gradient from the side of the silicon nitride liner 762 to the side of the thermal silicon oxide liner 763 over the distance of at least 0.6 nm (which may be at least 1.0 nm).

In one embodiment, the semiconductor structure comprises a continuous silicon oxide liner 761 continuously extending over the first and second field effect transistors ((110, 210), (210, 220)) and contacting a bottom surface of the silicon nitride liner 762, wherein: atomic concentration of oxygen atoms decreases to substantially zero from a side of the continuous silicon oxide liner to the side of the silicon nitride liner over a distance less than 0.6 nm (which may be less than 0.3 nm); and atomic concentration of nitrogen atoms decreases to substantially zero from the side of the silicon nitride liner 762 to the side of the continuous silicon oxide liner 761 over the distance less than 0.6 nm (which may be less than 0.3 nm).

In one embodiment, horizontal portions of the silicon nitride liner 762 have a uniform silicon nitride thickness throughout; and the thermal silicon oxide liner 763 has a first silicon oxide thickness over the first field effect transistor (110, 210). In one embodiment, the semiconductor structure can further comprise a third field effect transistor (130, 230) located on the substrate (10, 12), wherein the thermal silicon oxide liner 763 extends over the third field effect transistor (130, 230) with a second silicon oxide thickness that is less than the first silicon oxide thickness. In one embodiment, a ratio of the first silicon oxide thickness to the uniform silicon nitride thickness can be in a range from 0.1 to 10.

In one embodiment, horizontal portions of the thermal silicon oxide liner 763 overlying active regions (732P, 734P, 732N, 734N) of the first field effect transistor (110, 210) have a same thickness as tapered portions of the thermal silicon oxide liner 763 overlying a gate spacer 756 of the first field effect transistor (110, 210) and a horizontal portion of the thermal silicon oxide liner 763 overlying a gate electrode (752, 754) of the first field effect transistor (110, 210).

In one embodiment, the thermal silicon oxide liner 763 consists essentially of silicon and oxygen in portions other than an interfacial region that contacts the silicon nitride liner 762; and the planarization dielectric layer 770 includes hydrogen atoms at an atomic concentration greater than 3 part per million and carbon atoms at an atomic concentration greater than 1 part per million.

In one embodiment, the semiconductor structure comprises a CMOS device 102, the silicon nitride liner 762 generates tensile stress in respective underlying structures, the thermal silicon oxide liner 763 generates compressive stress in respective underlying structures, the first field effect transistor 110 comprises a p-type field effect transistor, and the second field effect transistor 220 comprises an n-type field effect transistor.

In another embodiment, the first field effect transistor (110, 210) and the second field effect transistor (120, 220) include channels having a same type of doping. For example, the first field effect transistor 110 and the second field effect transistor 120 can be p-type field effect transistors. Alternatively, the first field effect transistor 210 and the second field effect transistor 220 can be n-type field effect transistors. In one embodiment, the first field effect transistor 110 comprises a lower voltage field effect transistor than the second field effect transistor 120.

The various embodiments of the present disclosure can provide device specific channel stress by selecting the thickness of the silicon nitride liner 762 and an overlying portion of the thermal silicon oxide liner 763 for each type of field effect transistor.

By leaving the silicon nitride liner 762 under the thermal silicon oxide liner 763 over the p-type transistors (110, 120 and/or 130), the process can be simplified, since the removal of the silicon nitride liner 762 is not required. Furthermore, by thermally oxidizing the silicon nitride liner 762 to form the thermal oxide liner 763, a separate silicon oxide liner deposition step is not required, which reduces the total number of deposition steps.

In some embodiments, two or more independent non-zero thicknesses of the thermal silicon oxide liner 763 can be provided for different types of field effect transistors by multiple partial isotropic etching of the thermal silicon oxide liner 763. Further, in case a positive tone photoresist material is employed for the photoresist layer 77, repeated lithographic exposure and development can be employed on the same photoresist layer 77 to expand areas of the openings through the photoresist layer 77 between sequential controlled isotropic etch processes. Thus, removal and re-application of a photoresist material may be minimized for the multiple isotropic etch steps for the thermal silicon oxide liner 763.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A semiconductor structure comprising:
   a first field effect transistor and a second field effect transistor located on a substrate;
   a silicon nitride liner continuously extending over the first field effect transistor and the second field effect transistor;
   a thermal silicon oxide liner extending over the first field effect transistor and not extending over the second field effect transistor; and
   a planarization dielectric layer contacting the thermal silicon oxide liner over the first field effect transistor and contacting the silicon nitride liner over the second field effect transistor;
   wherein an interface between the silicon nitride liner and the thermal silicon oxide comprises a silicon oxynitride transition layer which has a compositional gradient such that: atomic concentration of nitrogen atoms increases with a nitrogen concentration gradient from a side of the thermal silicon oxide liner to a side of the silicon nitride liner over a distance of at least 0.6 nm; and atomic concentration of oxygen atoms increases with an oxygen concentration gradient from the side of the silicon nitride liner to the side of the thermal silicon oxide liner over the distance of at least 0.6 nm.

2. The semiconductor structure of claim 1, further comprising a continuous silicon oxide liner continuously extending over the first and second field effect transistors and contacting a bottom surface of the silicon nitride liner, wherein:
   atomic concentration of oxygen atoms decreases to substantially zero from a side of the continuous silicon oxide liner to the side of the silicon nitride liner over a distance less than 0.6 nm; and
   atomic concentration of nitrogen atoms decreases to substantially zero from the side of the silicon nitride liner to the side of the continuous silicon oxide liner over the distance less than 0.6 nm.

3. The semiconductor structure of claim 1, wherein:
   the semiconductor structure comprises a CMOS device,
   the silicon nitride liner generates tensile stress in respective underlying structures;
   the thermal silicon oxide liner generates compressive stress in respective underlying structures;
   the first field effect transistor comprises a p-type field effect transistor; and
   the second field effect transistor comprises an n-type field effect transistor.

4. The semiconductor structure of claim 1, wherein the first field effect transistor and the second field effect transistor include channels having a same type of doping.

5. The semiconductor structure of claim 4, wherein the first field effect transistor comprises a lower voltage field effect transistor than the second field effect transistor.

6. The semiconductor structure of claim 1, further comprising a third field effect transistor located on the substrate.

7. The semiconductor structure of claim 6, wherein:
   horizontal portions of the silicon nitride liner have a uniform silicon nitride thickness throughout;

the thermal silicon oxide liner has a first silicon oxide thickness over the first field effect transistor;

the thermal silicon oxide liner extends over the third field effect transistor with a second silicon oxide thickness that is less than the first silicon oxide thickness; and a ratio of the first silicon oxide thickness to the uniform silicon nitride thickness is in a range from 0.1 to 10.

8. The semiconductor structure of claim 1, wherein horizontal portions of the thermal silicon oxide liner overlying active regions of the first field effect transistor have a same thickness as tapered portions of the thermal silicon oxide liner overlying a gate spacer of the first field effect transistor and a horizontal portion of the thermal silicon oxide liner overlying a gate electrode of the first field effect transistor.

9. A three-dimensional NAND memory device, comprising:

the semiconductor structure of claim 1 located over a substrate;

an alternating stack of insulating layers and word lines located over the semiconductor structure; and memory stack structures extending through the alternating stack and comprising a respective memory film and a vertical semiconductor channel.

* * * * *